(12) United States Patent
    Hollis

(10) Patent No.: US 8,271,239 B2
(45) Date of Patent: *Sep. 18, 2012

(54) GENERATION AND MANIPULATION OF REALISTIC SIGNALS FOR CIRCUIT AND SYSTEM VERIFICATION

(75) Inventor: Timothy M. Hollis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 199 days.

This patent is subject to a terminal disclaimer.

(21) Appl. No.: 12/755,165

(22) Filed: Apr. 6, 2010

(65) Prior Publication Data
US 2010/0198575 A1    Aug. 5, 2010

Related U.S. Application Data

(63) Continuation of application No. 11/549,646, filed on Oct. 14, 2006, now Pat. No. 7,720,654.

(60) Provisional application No. 60/727,207, filed on Oct. 15, 2005.

(51) Int. Cl.
    *G06F 17/50*    (2006.01)
    *G10L 19/08*    (2006.01)
    *G06F 9/44*     (2006.01)

(52) U.S. Cl. .................... 703/2; 703/5; 703/14; 703/17; 708/300; 375/350

(58) Field of Classification Search .................. 703/2, 5, 703/14; 375/350; 708/300
See application file for complete search history.

(56) References Cited

U.S. PATENT DOCUMENTS

| 6,366,573 | B1 * | 4/2002 | Smith et al. .................... 370/349 |
| 7,113,559 | B2 * | 9/2006 | Baas et al. ..................... 375/350 |
| 7,430,257 | B1 | 9/2008 | Shattil |
| 7,450,044 | B2 | 11/2008 | Moore et al. |
| 7,720,654 | B2 * | 5/2010 | Hollis ............................... 703/2 |

(Continued)

OTHER PUBLICATIONS

J. Sifri, M. Adada, and K. Kalbasi, "RF Design Environment Closes Verification Gap", Microwaves & RF: Trusted Resource for the Working RF Engineer. http://www.mwrf.com/Articles/Index.cfm?ArticleID=6854, Nov. 2003.

(Continued)

*Primary Examiner* — Thai Phan
(74) *Attorney, Agent, or Firm* — Schwegman, Lundberg & Woessner, P.A.

(57) ABSTRACT

Methods for generating realistic waveforms with controllable voltage noise and timing jitter in a computer-based simulation environment and the simulation of a subset of those waveforms with system elements along the signal path is disclosed. By deriving a generic, re-useable, parameterized Fourier series, time-domain clock and pseudo-random data signals are generated from a subset of their true harmonic components. Time-domain signal parameters including high, low, and common-mode voltage levels, transition slew-rates, transition timing, period and/or frequency, may be designated by the user, and the computer calculates the harmonic components that will combine through the inverse Fourier transform to provide the required time-domain characteristics. By computing the frequency content of the signal directly it is possible to simulate the interaction of the signal with various system blocks while remaining in the frequency domain, thereby reducing simulation time and memory requirements. By allowing the parameters of the signal model to vary on a cycle-to-cycle basis, signal characteristics such as voltage noise and timing jitter may be modeled with flexibility and precision down to the numerical limitations of the simulator.

31 Claims, 21 Drawing Sheets

U.S. PATENT DOCUMENTS

| | | | | |
|---|---|---|---|---|
| 7,899,653 | B2* | 3/2011 | Hollis | 703/2 |
| 7,953,579 | B2* | 5/2011 | Hollis | 703/2 |
| 2003/0133423 | A1 | 7/2003 | LaDue | |
| 2003/0231714 | A1 | 12/2003 | Kjeldsen et al. | |
| 2004/0091055 | A1 | 5/2004 | Williams | |
| 2006/0200016 | A1 | 9/2006 | Diab et al. | |
| 2007/0100596 | A1* | 5/2007 | Hollis | 703/14 |
| 2009/0063111 | A1* | 3/2009 | Hollis | 703/5 |
| 2009/0112551 | A1* | 4/2009 | Hollis | 703/14 |

OTHER PUBLICATIONS

B.P. Lathi, *Signal Processing & Linear Systems*, Berkeley Cambridge Press, Carmichael, CA, pp. 1998, 352-357.

Agilent Technologies, "Guide to Harmonic Balance Simulation in ADS: Sep. 2004", 1998-2004.

R. Telichevesky, K. Kundert, and J. White, "Receiver Characterization Using Periodic Small-Signal Analysis," IEEE Custom Integrated Circuits Conference, 1996, pp. 449-452.

H. Jokinen and M. Valtonen, "Steady-State Time-Domain Analysis Including Frequency-Dependent Components," http://www.aplac.hut.fi/publications/ct-24/ct-24.pdf, Jun. 1995.

T.M. Hollis, D.J. Comer, and D.T. Comer, "Reduction of Duty Cycle Distortion through Bandpass Filtering", 2005 PhD Research in Microelectronics and Electronics, Jul. 25-25, 2005, pp. 116-120.

Tektronix, "Controlled Jitter Generation for Jitter Tolerance and Jitter Transfer Testing", Appl. Note 61W-18431-3, 2005.

B. K. Casper, M. Haycock, and R. Mooney, "An accurate and Efficient Analysis Method for Multi-Gb/s Chip-to-Chip Signaling Schemes," 2002 Symposium on VLSI Circuits Digest of Technical Papers, 2002, pp. 54-57.

P. K. Hanumolu, B. K. Casper, R. Mooney, G.-Y. Wei, and U.-K. Moon, "Analysis of PLL Clock Jitter in High-Speed Serial Links," IEEE Transactions on Circuits and Systems—II: Analog and Digital Signal Processing, vol. 50, No. 11, Nov. 2003, pp. 879-886.

G. Balamurugan and N. Shanbhag, "Modeling and Mitigation of Jitter in Multi-Gbps Source-Synchronous I/O Links," Proceedings of the 21st International Conference on Computer Design. IEEE, Oct. 2003, pp. 254-260.

F. K. Becker, L. N. Holzman, R. W. Lucky, and E. Port, "Automatic Equalization for Digital Communication," Proceedings of the IEEE, vol. 53, Jan. 1965, pp. 96-97.

M. E. Austin, "Decision-Feedback Equalization for Digital Communication Over Dispersive Channels," Massechusetts Institute of Technology: Research Laboratory of Electronics, Technical Report 461, Aug. 11, 1967.

J. W. M. Bergmans, "Decision Feedback Equalization for Digital Magnetic Recording Systems," IEEE Transactions on Magnetics, vol. 24, No. 1, Jan. 1988, pp. 683-688.

J. Buckwalter, B. Analui, and A. Hajimiri, "Predicting data-Dependent Jitter," IEEE Transactions on Circuits and Systems—II: Express Briefs, vol. 51, No. 9, Sep. 2004, pp. 453-457.

E. Song, J. Lee, J. Kim, D. G. Kam, C. Ryu, and J. Kim, "Data-Dependent Jitter Estimation Using Single Pulse Analysis Method," 2005 Electronics Packaging Technology Conference, Dec. 2005, pp. 810-813.

R. Holzlohner, V. S. Grigoryan, C. R. Menyuk, and W. L. Kath, "Accurate Calculation of Eye Diagrams and Bit Error Rates in Optical Transmission Systems Using Linearization," IEEE Journal of Lightwave Technology, vol. 20, No. 3, Mar. 2002, pp. 389-400.

A. Sanders, M. Resso, and J. D'Ambrosia, "Channel compliance testing utilizing novel statistical eye methodology," in Proceedings of Design-Con 2004. International Engineering Consortium, Feb. 2004.

"Fast Fourier Transform." Wikipedia. http://en.wikipedia.org/wiki/Fast_Fourier_transform (publication date unknown).

"Fast Fourier Transform (FFT)." http://www.cmlab.csie.ntu.edu.tw/cml/dsp/training/coding/transform/fft.html (publication date unknown).

Don Johnson, "Fast Fourier Transform (FFT)." http://cnx.org/content/m10250/latest/ (Apr. 2005).

M. H. Hayes, "Statistical Digital Signal Processing and Modeling," 1st ed. New York: John Wiley & Sons, Inc., 1996, pp. 20.

* cited by examiner

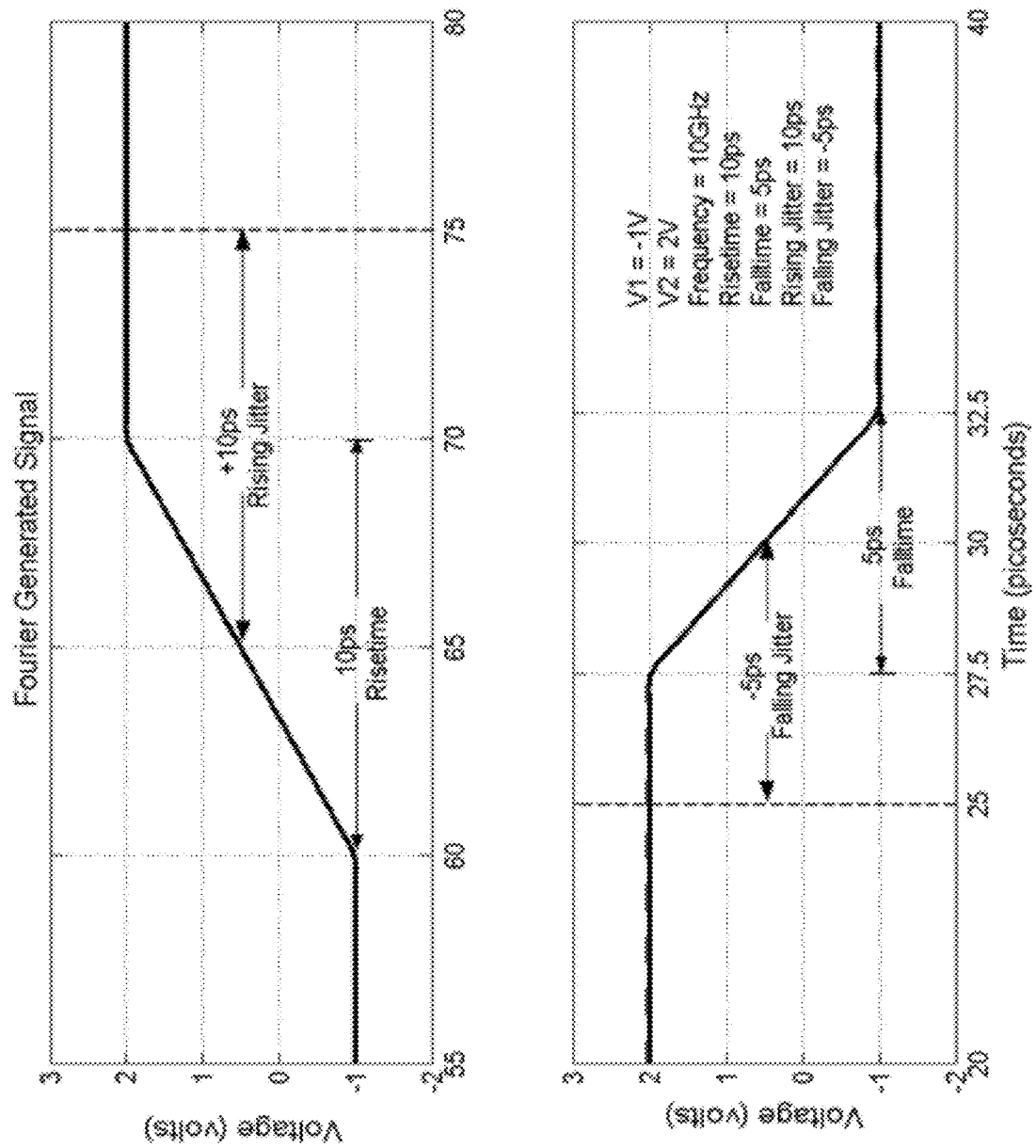



GENERATION AND MANIPULATION OF REALISTIC SIGNALS FOR CIRCUIT AND SYSTEM VERIFICATION

CROSS-REFERENCE TO RELATED APPLICATIONS

This application is a continuation of U.S. patent application Ser. No. 11/549,646, filed Oct. 14, 2006, which was in turn a non-provisional filing based on U.S. Provisional Patent Application Ser. No. 60/727,207, filed Oct. 15, 2005. Priority is claimed to both of these applications, and both are incorporated herein by reference in their entireties.

FIELD OF THE INVENTION

Embodiments of this invention relate to improved methods for simulating periodic and aperiodic signals in a computerized simulation program, and in particular for improving the modeling of timing jitter in the signals being simulated.

BACKGROUND

It is common practice in the art of integrated circuit design to simulate the operation of a given circuit using a computer system. Using simulation software allows the circuit designer to verify the operation and margins of a circuit design before incurring the expense of actually building and testing the circuit. Simulation is particularly important in the semiconductor industry, where it is generally very expensive to design and produce a given integrated circuit. Through the use of such simulations, design errors or risks are hopefully identified early in the design process, and resolved prior to fabrication.

As data-rates approach and surpass multi-Gigabit/second (Gb/s) levels, the challenge of maintaining signal integrity across chip-to-chip interconnects grows due to the introduction of several analog phenomena which impact digital signals in the Gigahertz (GHz) frequency range. Fortunately, many of the parasitic effects of the inter-chip channel are not new and neither is the demand for speedy performance. Over the past century several communication media ranging from the telegraph to fiber optics have been explored and employed to meet the requirements of society. In every case bandwidth limitations have been overcome, or at least mitigated, through the ingenuity of communication engineers, and it is through the leveraging of proven signal conditioning techniques that data-rates have achieved their current levels.

Today the push toward ever higher operating speeds in electronics is driven, in part, by growing software complexity. Unfortunately, even as micro-processor unit (MPU) operating speeds and computational efficiency increase, the sheer complexity and mass of the associated software obscures much of the performance enhancement obtained at higher clock frequencies.

To maintain a given level of perceived performance, added complexity in the underlying simulation software must be balanced or tracked by improvements in processing efficiency. That processing efficiency is not only a function of the clock frequency of the MPU, but is also highly dependent upon the available system memory and the rate at which the MPU, memory, and other peripheral components communicate.

To accommodate the electronics consumer's insatiable appetite for bandwidth, MPUs are forced to share their computational burden with other application specific chips, for example, memory controllers or video processors. While on-chip signal distortion is typically reduced by parallel-izing the data to allow for lower frequency intra-chip transmission, the growing cost of each input/output (I/O) pin on the integrated circuit package demands that the inter-chip data-rate be as high as possible, potentially resulting in severe signal degradation.

Obstacles facing digital communication engineers are not limited to the design of signal conditioning circuitry, but include the task of developing models and methodologies suitable for capturing and characterizing the newly encountered signal degradation as well as for analyzing and verifying proposed signal conditioning solutions.

The challenge associated with simulating channel-affected signals is highly correlated to the characteristics of the degradation. As will be discussed in greater detail, signals in any transmission medium experience both random and deterministic degradation. Random degradation, in the form of random Gaussian distributed voltage noise and timing noise or jitter stemming from thermal and shot noise, requires statistical quantification. Similarly, deterministic voltage noise and jitter are linked to several sources including power supply noise, inter-channel crosstalk, impedance discontinuities, component variance, and at high frequencies the response of the channel, resulting in a variety of observable characteristics, from periodicity to uncorrelated-bounded randomness. To model these noise components correctly requires the ability to designate their probability during the noise generation stage and consequently inject or superimpose these effects onto the underlying signal in a way reflecting what occurs in the actual system. The final success or robustness of a particular design is dependent, to a large measure, on the achieved realism of the simulation environment.

To date, industry standard simulators do not provide the level of noise and jitter generation control needed to accurately model a realistic communication link. While some of the more advanced, and hence expensive, tools provide for an accurate generation of Gaussian distributed noise and jitter, no simulator in existence allows for the derivation of signals exhibiting the random, periodic, and aperiodic jitter encountered in the real world. The nearest approximation is found in Agilent's Advanced Design System (ADS). ADS provides a square-wave clock with Gaussian distributed random jitter for transient simulation. In addition to serving as a jittery clock source, the clock function may also be used to trigger a random data source, thereby adding random jitter to the data signal. While the simulated jitter closely approximates a true Gaussian distribution, other jitter components commonly encountered in fabricated circuits are not directly realizable in ADS (sinusoidal jitter, uncorrelated bounded jitter, etc.).

To be fair, it is possible to formulate piecewise linear functions (PWLs) with tools like Matlab, as well as within Spice-based simulators, through the careful architecting of time and voltage vectors, wherein the voltage amplitude is designated for each step in time. But to approximate Gaussian distributed noise and jitter, as well as other specific noise distributions, over hundreds or thousands of cycles through this method is more than daunting.

Another challenge in simulating realistic signaling environments is tied to the underlying statistical assumption that sufficient samples of the behavior to be characterized are readily available. As such, it is becoming necessary to include more and more cycles with each simulation. At the same time, the relative size of each individual noise component is very small with respect to the overall cycle period, implying that fine voltage and timing resolution are also necessary. When fine simulated resolution is coupled with a greater number of simulated cycles, the result is an enormous amount of data and prohibitively lengthy simulation times. It is not uncommon for transistor-level transient (time-based) simulations to run for hours or even days. It is likewise not uncommon for such a simulation to fail due to a lack of memory resources.
Current Simulation Techniques:

At multi-Gb/s data rates, the statistical nature of signal degradation coupled with the already vanishing voltage and timing margins has lead to advances in channel and circuit modeling. Alternative computational algorithms have been incorporated into existing simulators to complement traditional circuit analysis, while and at the same time, high-level tools like Matlab are finding greater use in the verification process, as has been mentioned. To efficiently capture the true impact of the entire communication link on signal integrity with the requisite level of precision requires an interleaving of simulation at both the transistor and system levels.

Transistor-level analysis refers to the schematic entry of specific circuit blocks into Spice-like tools such as HSpice, PSpice, Cadence, and ADS for AC or transient analysis, which are complementary methods for determining signal integrity. AC analysis computes the frequency response of the channel or circuit and can help identify noise components and other degradation most visible in the frequency domain. Unfortunately, AC analysis is only carried out for a fixed circuit bias condition, while transient analysis provides a time-domain simulation of the circuit behavior accounting for dynamic changes in the circuit biasing resulting from varying input levels and/or supply noise, thereby presenting the real-time impact of environmental conditions on passing signals.

During transient analysis, differential equations relating the voltage and current at each circuit node are evaluated at specified points in time. The time that elapses with each computation increases when diodes, transistors, and other components exhibiting nonlinear voltage-to-current relationships are included. To control the overall simulation run time, the level of precision in both time and amplitude are often controllable. For example, the desired level of voltage or current resolution in Spice-based tools is designated through the AbsTol (absolute tolerance) parameter. Requiring tighter tolerance leads to a greater number of computational iterations to meet an associated error level while solving the differential nodal equations at each time step.

In a similar way, the timing resolution may be enhanced by decreasing the time span between each calculation. While simulators like HSpice, ADS, Spectre (Cadence), and HSim allow for the designation of a minimum transient step size, PSpice does not provide direct control over the minimum time step, but rather provides a maximum time step parameter which constrains the simulator to make at least one evaluation within the designated interval. Thus, for the purpose of jitter characterization, the timing precision of the industry-wide transient simulator is improved through a reduction in the simulated time step, the result of which is a simultaneous increase in both the simulation run time and the memory requirement.

In addition to the requirement of sub-picosecond timing resolution, the statistical nature of random noise and jitter demand that the signal-system interaction be computed over several clock cycles in order to provide the necessarily large number of samples required to properly build up probability distributions. Coupling the constraints of high resolution (small transient time step) with the need to observe the behavior over thousands or millions of cycles extends the transistor-level simulation run time and memory requirements even further.

An attempt to overcome the weaknesses of the general transient simulator has lead to the development of alternative time-domain algorithms including Harmonic Balance, Circuit Envelope, and Periodic Steady State simulation. While these techniques have many distinct features, they all seek to avoid or minimize the time step dependency of transient simulation by operating as much as possible in the frequency domain. See Agilent Technologies Technical Staff, "Guide to Harmonic Balance Simulation in ADS," Available online at http://eesof.tm.agilent.com/docs/adsdoc2004A/pdf/adshbapp.pdf, (September 2004); J. Sifri et. al., "RF Design Environment closes verification gap", in Microwaves & RF for Designers at Higher Frequencies, available online: http://www.mwrf.com/Articles/Index.cfm?ArticleID=6854 (November 2003); and R. Telichevesky et al., "Receiver Characterization Using Periodic Small-Signal Analysis," in Proceedings of the IEEE Custom Integrated Circuits Conference, pp. 449-452 (May 1996), all of which are submitted with an Information Disclosure Statement filed with this application and are incorporated by reference herein in their entireties.

As long as the circuit element passing the signal can be accurately modeled as a linear time-invariant (LTI) system, the time-consuming process of convolving the signal with the circuit impulse response in the time-domain may be replaced by simple vector multiplication in the frequency domain due to the relationship:

$$A \otimes B = FT\{A\} \times FT\{B\}$$

where $\otimes$ denotes convolution and $FT\{\ \}$ denotes the Fourier Transform. The computational efficiency gained through this substitution is illustrated by considering the time-domain convolution of two vectors A and B, which could represent a signal and the impulse response of the circuit through which it is passing. Recall first that the process of discrete-time convolution is carried out through the formula:

$$C(n) = \sum_{k=-\infty}^{\infty} A(k)B(n-k)$$

Due to the finite length of the vectors under consideration, the sum need not be carried out to infinity. Thus, the number of computational steps to perform the convolution is found through $$1 + M + N + 2\sum_{k=0}^{N}(M+N-k)^2 - \alpha M^2$$

$$\text{where } \alpha = \begin{cases} 1 & \text{if } M+N \text{ is even} \\ 0 & \text{if } M+N \text{ is odd} \end{cases}$$

where M and N are the number of elements in the longer and shorter of the two arrays respectively. Accordingly, the convolution of two vectors of 1000 elements each would require 4,670,669,001 mathematical steps. This may be contrasted with the number of steps needed to convert the two vectors to the frequency domain, perform an element-to-element multiplication, and return to the time domain, a process often referred to as Fast Convolution. When the Fourier Transform and Inverse Fourier Transform processes are carried out via the Fast Fourier Transform (FFT) and Inverse Fast Fourier Transform (IFFT) algorithms, the time-to-frequency and frequency-to-time domain translations require as little as (½)×(N log₂ N) complex multiplications and N log₂ N complex addition steps each. See M. H. Hayes, "Statistical Digital Signal Processing and Modeling," 1st ed. New York: John Wiley & Sons, Inc., pp. 20 (1996). For the two equal length vectors under consideration, this leads to a total number of 4.5N log₂ N+N, or 45,846 computational steps to convert both vectors to the frequency domain, multiply them and return to the time domain. To be fair, increased accuracy and efficiency in the FFT algorithm is insured by padding each data set with zeros to the nearest power of two greater than the sum of the two data set lengths. Thus for M=N=1000, the actual number of data points involved in the FFT process will equal 2048, causing the total number of steps in the overall calculation to increase to 103,424, yet still significantly shorter than direct convolution.

Unfortunately, this reduction in mathematical steps is only realized when the simulated circuits can be linearized. Thus Harmonic Balance and the other more sophisticated simulation algorithms tend to divide the simulated system down into those parts which can be appropriately modeled as LTI, and those parts which require nonlinear analysis (e.g. circuits containing diodes and transistors passing large signals). In Circuit Envelope simulation, further efficiency is gained by only performing frequency domain multiplication over the spectrum of the passing signal while avoiding unnecessary calculations at unrelated frequencies. The ability of these more sophisticated algorithms to handle nonlinear circuit elements while exploiting the speed of frequency domain calculation is somewhat washed out, as they tend to target radio frequency (RF) circuit design, and in doing so incorporate functionality (complexity), such as signal mixing and inter-modulation analysis, not typically considered or even applicable in baseband link verification.

Because simulation time and memory requirements associated with transistor level Spice-based evaluation are prohibitive, much of high-speed link design and verification is carried out at the system level with programs like Matlab. These tools allow the designer to take a more statistical look at the link behavior. See B. K. Casper et al., "An Accurate and Efficient Analysis Method for Multi-Gb/s Chip-to-Chip Signaling Schemes," in Digest of Technical Papers from the IEEE Symposium on VLSI Circuits, pp. 54-57 (June 2002), which is incorporated herein by reference in its entirety.

Modeling Trends:

To speed design-to-market time, the growing trend is to compartmentalize system circuitry during the verification process. Rather than simulate the full system at the transistor level, smaller circuit blocks are characterized in Spice-based simulators at the transistor level, and then those characteristics are used to construct behavioral models that may be included in simulations at higher levels of abstraction in programs like Matlab. This methodology is very effective when implemented carefully, but has the potential for providing unrealistic performance predictions, as much of the nonlinear circuit behaviors are lost in the translation from transistor level to behavioral circuits.

In addition to breaking the system down into more manageable blocks, it is not uncommon for voltage and timing noise to be evaluated independently. One of the weaknesses in this approach is that it fails to capture the interaction and interdependency of voltage noise and timing jitter, which deficiency may be linked to an inability to generate waveforms with control over both components of signal degradation. As will be shown, voltage and timing noise exhibit a synergistic relationship, wherein each leads to the other and together they combine to limit performance wherever they are encountered.

At the lower data-rates of the past, voltage noise was the dominant concern, leading to signal-to-noise ratio (SNR) boosting circuits like the matched filter and inter-symbol interference (ISI) canceling channel equalizers. See, e.g., R. W. Lucky et al., "Automatic Equalization for Digital Communication," Proceedings of the IEEE (Correspondence), vol. 53, pp. 96-97 (January 1965); M. E. Austin, "Decision-Feedback Equalization for Digital Communication Over Dispersive Channels," Massachusetts Institute of Technology: Research Laboratory of Electronics, Tech. Rep. 461 (August 1967); and J. W. M. Bergmans, "Decision Feedback Equalization for Digital Magnetic Recording Systems," IEEE Transactions on Magnetics, vol. 24, no. 1, pp. 683-688 (January 1988), all of which are incorporated herein by reference in their entireties. But at multi-Gb/s data-rates, the inherently short symbol period or unit interval (UI) has shifted attention from the voltage axis to the time axis. And whereas noise budgets were once an essential part of the initial design specification, jitter budgets are now the more common focus. While this trend may appear to justify the independent analysis of voltage noise and jitter when one of the two is the more dominant performance limiter, increased accuracy is still achieved when both noise components are considered simultaneously.

The growing emphasis on timing has given way to new terminology, closely resembling the vocabulary already associated with voltage domain characteristics (jitter impulse response, jitter transfer function, etc.). With the jitter transfer function, and its time-domain corollary the jitter impulse response, it is possible to track the effects of a system on passing jitter, in much the same way that the effects of a system on signal amplitude are computed through the voltage transfer function. Thus, the jitter accumulation that occurs as a signal passes through a particular system block may be calculated through the convolution of the jitter distribution at the block input with the block's jitter impulse response. Similarly, just as uncorrelated noise may be directly added to a signal passing a certain point in the system, when modeled independent of any signal, uncorrelated jitter may be directly added to the accumulated jitter at any point as well.

In real systems, however, voltage noise at a particular point may lead to timing noise in various ways depending upon how the two are coupled, and the accuracy of independent jitter modeling would be improved by approximating that coupling or correlation between voltage and timing. For example, and as shown in FIG. 1, it is well understood that voltage noise in a signal is translated into timing noise at each signal transition through the signal slew-rate. Thus, FIG. 1 shows the same voltage noise distribution translated into two distinct jitter distributions through fast and slow rising edges. As the voltage noise causes fluctuations in the signal at each point in time, the time at which the signal crosses the detection threshold will also vary resulting in a corresponding change in the observed jitter. For Gaussian distributed noise, the rms value of the voltage distribution may be divided by the slope of the signal transition near the midway point to approximate the rms jitter level, verifying the well known fact that faster edges, though potentially problematic for other reasons, often result in lower observed jitter.

A second connection between voltage and timing noise is through the power supply. When a transistor's supply levels vary, through voltage droop or ground bounce, at least two things happen. The first is that those perturbations may bleed through to the output signal via parasitic capacitances, depending upon the slope of the perturbations' edges or the frequency of on-going supply noise. Second, slower supply variations change the bias conditions of the circuit devices and may speed up or slow down the device performance for a moment leading to timing deviation in any corresponding output transitions. In the case of a CMOS inverter, slower perturbations may alter the voltage trip point, again shifting the output transition in time. Additional coupling of supply noise to the signal may also occur through the several pull-up and pull-down resistors scattered throughout the system.

To account for the points just discussed, more careful models adopt a voltage noise to jitter scaling factor, which approximates the average $\Delta T_{edge}/\Delta V_{supply}$. While such approximations do provide useful jitter predictions, when designing to meet a required jitter budget they fail to capture much of the nonlinear voltage-to-noise translation that occurs in realized circuits, as most of these approaches make assumptions regarding the biasing and general performance of the associated transmit and receive circuitry. These methods also fail to capture the sensitivity of the data sampling mechanism to noise, and to account for the combined degradation imposed by simultaneous voltage and timing noise.

In addition, not all jitter exhibits such a deterministic relationship with voltage noise. For example, the magnitude of an oscillator's phase noise may depend upon voltage noise in the silicon substrate, yet the relationship is unpredictable. Similarly, the jitter at the output of a phase-locked loop (PLL) is related to the jitter of the input signal filtered by the control loop plus the contribution of power supply noise nonlinearly translated into timing noise through several distinct circuit components. In this case, knowledge of the environmental noise is not enough to accurately predict the jitter at the PLL output, and this difficulty in correlating voltage and timing noise sometimes makes it necessary to add jitter terms directly to the model equations. This turns out to be difficult, and as a result, a new model is often adopted which neglects the voltage dimension of the signal when jitter is the dominant concern.

Perhaps the strongest argument for developing full signals with noise and jitter, rather than maintaining independent noise and jitter models, is the impact of ISI. While unbounded Gaussian noise and jitter lead to long term bit errors, depending upon the bandwidth of the channel, ISI and the corresponding data-dependent jitter (DDJ) may dominate the short term signal degradation. Recent papers have proposed methods for predicting the DDJ distribution from the relationship of the data-rate and the channel bandwidth, see J. Buckwalter et al., "Predicting Data-Dependent Jitter," IEEE Transactions on Circuits and Systems II: Express Briefs, vol. 51, no. 9, pp. 453-457 (September 2004), which is incorporate herein by reference in its entirety, but these techniques still do not provide a means for visualizing the interaction of a dynamic or moving sampling point with a moving data eye.

Still other methods exist for measuring signal integrity while avoiding full signal generation, including the construction of worst-case eye diagrams through peak distortion analysis and the formulation of bit error rate (BER) eye diagrams through statistical analysis, as presented in the B. K. Casper reference cited earlier. Worst case eyes are useful for predicting performance limits, but as chip-to-chip links often target BERs of $10^{-12}$, a worst case eye approximating $10^{-20}$ is overkill and may lead to unnecessary pessimism and un-required compensation in the design. The BER eye is more informative in that it identifies the BER associated with a given skew in the detection reference voltage and/or the sample timing. Unfortunately, these last few techniques are based on the system impulse response, which again corresponds to a specific circuit and system condition (temperature, biasing, etc.).

With the following background in hand, it should be apparent that the art of signal simulation includes several different techniques, each with their advantages and disadvantages. However, an improved solution would tend to promote the advantages without concomitant disadvantages. In other words, an improved signal simulation technique would at least: allow for the formation a signal for simulation in which noise, such as timing jitter, is easily and realistically modeled; allow the inter-relationship between voltage noise and timing jitter to be respected and concurrently modeled; allow for the simulation of both period and aperiodic signals; allow for the simulation of linear or nonlinear signals; and with good computational efficiency across all such types of signals. The disclosed techniques achieve such results in a manner easily implemented in a typical computerized system or other computerized circuit simulation software package.

BRIEF DESCRIPTION OF THE DRAWINGS

Embodiments of the present invention will be best understood with reference to the following detailed description, when read in conjunction with the accompanying drawings, in which:

FIGS. 3B and 3C illustrate a magnified view of rising and falling edges of the cycle of FIG. 3A.

DETAILED DESCRIPTION

Figure 1:
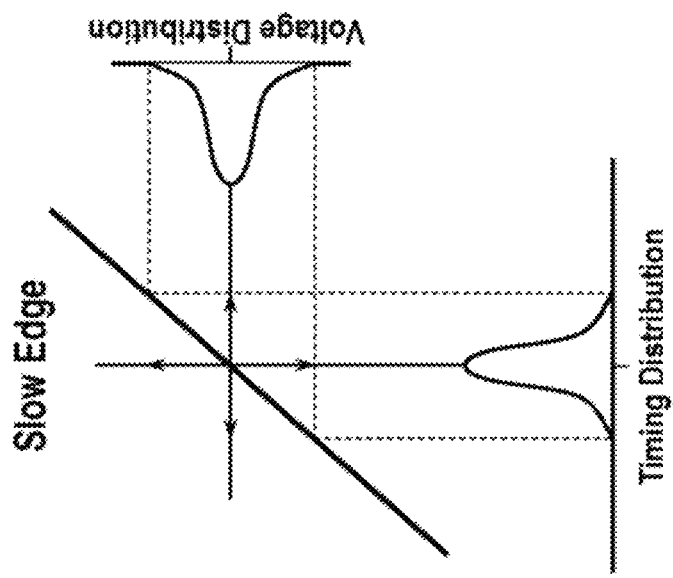
FIG. 1 is a prior art illustration of the translation of voltage noise to timing noise through the signal slew-rate.
Figure 1:
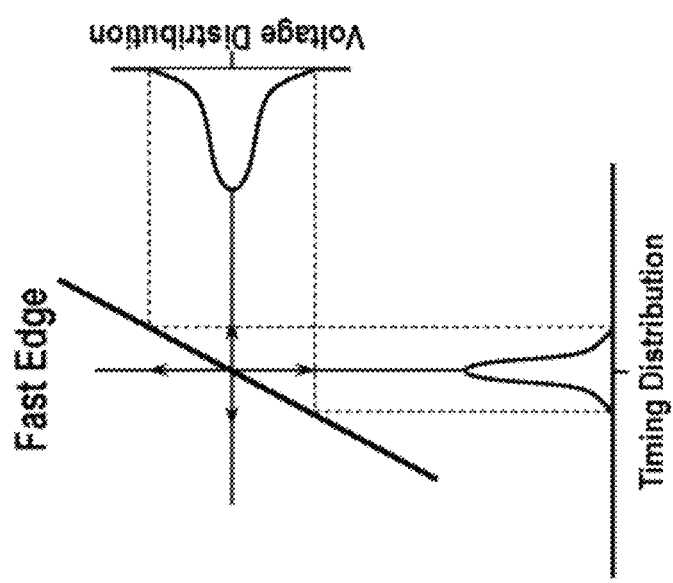

Methods for generating realistic waveforms with controllable voltage noise and timing jitter in a computer-based simulation environment, and the simulation of a subset of those waveforms with system elements along the signal path in a computer-based simulation environment, are disclosed. Beneficially, the timing precision of the signals generated by the disclosed techniques is constrained only by the numerical limitations of the underlying computational tool.

Embodiments of the disclosed techniques for generating controllably degraded clock and data signals are based on Fourier theory, which states that any periodic waveform may be represented as a simple DC value combined with an infinite sum of sine-waves and/or cosine-waves at specific harmonic frequencies, as discussed further below. The periodic nature of clock signals makes them well suited for Fourier series representation, while the aperiodic nature of data signals (e.g., random bit streams) does not lend itself to Fourier series representation directly. To overcome this, a few steps must be added to the data signal generation process to provide for arbitrary bit streams, as is discussed below.

Prior to a detailed discussion of embodiments of the technique, it should be noted that the use of Fourier theory is a preferred transform technique for implementing embodiments of the invention. However, it is possible that other transform techniques could be investigated and used as well, such as Laplace transforms, Z-transforms, etc., in which case the transform coefficients from such other techniques could be used.

Embodiments of the disclosed techniques can vary depending on the type of waveform to be generated and/or simulated. A brief summary of the applicability of the disclosed techniques to the generation and simulation of periodic and aperiodic waveforms is provided next, with detailed discussions of aspects of the techniques to follow.

Purely Periodic Waveforms and Initially Purely Periodic Waveforms:

For a purely periodic signal, including ideal clock signals and clock signals exhibiting DCD, a parameterized Fourier series is derived for a finite number of harmonics, which harmonics can logically be constrained, for example, in accordance with the attenuation of the channel through which the waveform is to pass. In other words, the Fourier coefficients ($A_0$, $A_n$, and $B_n$ are calculated for the finite number of harmonic frequencies. The Fourier series is parameterized such that signal time-domain variables, such as high, low, and common-mode voltage levels, transition slew-rates, transition timing, period and/or frequency, may be designated by the user. This is explained further below in the section entitled "Fourier-based Clock Signal Derivation."

In the case of purely periodic signals, signal-system interaction computation can be carried out completely independent of time, as discussed in the section entitled "Enhanced Clock Simulation Efficiency." This occurs through scaling the signal harmonics derived from the parameterized Fourier series by the frequency response of the system block under consideration, and reconstructing the resulting time-domain waveform through the Inverse Fourier Transform process. This reduces the simulation time and simulator memory requirements significantly.

For purely periodic signals, additional quasi-random noise and jitter generated from a set of carefully chosen sinusoids at unrelated frequencies and statistically chosen amplitudes may be added to the set of existing signal harmonics. This again allows signal-system interaction computation to be carried out completely independent of time, as discussed in the section entitled "Enhanced Clock Simulation Efficiency." After combining the original signal harmonics with the additional noise sources, the complete set of sinusoids may be scaled by the frequency response of the system block under consideration to simulate the impact of the system on the signal and noise. Again, the resulting time-domain waveform incorporating both the signal and noise may be reconstructed (e.g., with an IFFT), reducing simulation time and memory requirements.

Noise can also be added to a signal which is initially purely periodic in nature to produce a waveform which is ultimately aperiodic, but compatible with industry-standard circuit simulators, as discussed in the section entitled "Unconstrained Waveform Generation." As discussed there, incorporating explicit timing noise or jitter characteristics can be achieved by treating the edge transition timing parameters as either random or deterministic variables and applying the desired timing deviations on a cycle-to-cycle basis, while re-computing the Fourier coefficients or signal harmonics at each cycle. The waveform to be simulated can then be reconstructed using the Inverse Fourier Transform process.

In the case of initially purely periodic signals, the circuit-simulator-compatible waveform produced may also incorporate explicit voltage noise by treating the low and high voltage level parameters as either random or deterministic variables and applying the desired voltage deviations on a cycle-to-cycle basis. Similarly, explicit phase noise or frequency wander can be incorporated into the signal by treating the signal period as either a random or deterministic variable and applying the desired period timing deviations on a cycle-to-cycle basis. These modifications are also discussed below in the section entitled "Unconstrained Waveform Generation."

Aperiodic Waveforms:

For aperiodic waveforms, including data bit streams, the process may involve more steps, but is still computationally efficient. As with purely periodic signals, a parameterized Fourier series is derived for pseudo-random data symbols encountered in the stream, and Fourier coefficients are calculated for a finite number of harmonics for each of the data symbols. Again, the Fourier series is parameterized such that signal time-domain variables, such as high, low, and common-mode voltage levels, transition slew-rates, transition timing, period and/or frequency, may be designated by the user. The pseudo-random data symbols may be encoded to facilitate the derivation of the parameterized Fourier series in the process of generating signals adhering to a variety of signal encoding schemes (e.g. RZ, 4-PAM, PSK, Manchester, Duobinary, etc.). This is explained further below in the section entitled "Fourier-based Data Signal Derivation."

As was the case with the purely periodic signals discussed above, the disclosed method allows for the production of a waveform compatible with industry-standard circuit simulators, as discussed in the section entitled "Unconstrained Waveform Generation," which incorporates explicit timing noise or jitter characteristics by treating the edge transition timing parameters as either random or deterministic variables and applying the desired timing deviations on a cycle-tocycle basis, while re-computing the Fourier coefficients or signal harmonics at each cycle.

As was the case with the purely periodic signals, the circuit-simulator-compatible waveform produced may also incorporate explicit voltage noise by treating the low and high voltage level parameters as either random or deterministic variables and applying the desired voltage deviations on a cycle-to-cycle basis. Similarly, explicit phase noise or frequency wander may be incorporated into the signal by treating the signal period as either a random or deterministic variable and applying the desired period timing deviations on a cycle-to-cycle basis. These modifications are discussed below in the section entitled "Unconstrained Waveform Generation."

Figure 2:
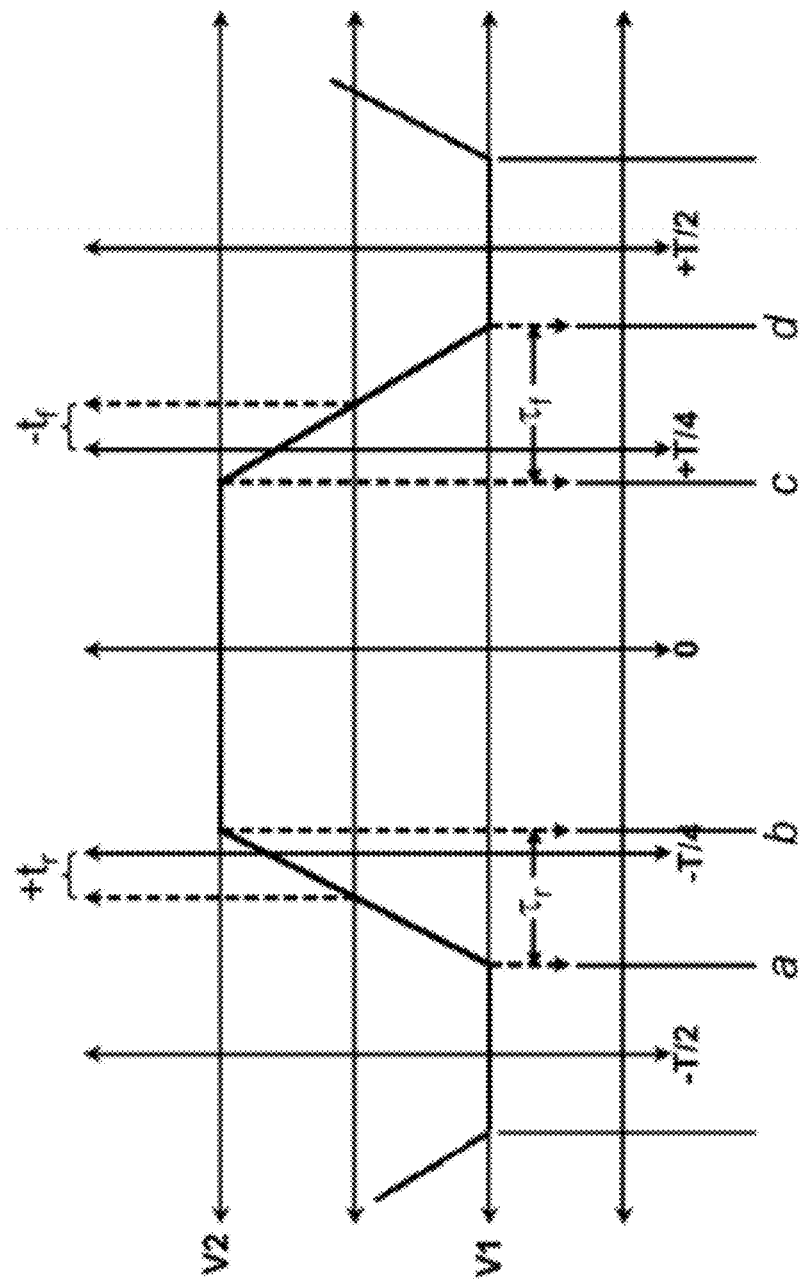
FIG. 2 illustrates a piecewise-linear function from which coefficients of a generic Fourier series are derived.

Fourier-Based Clock Signal Derivation:

The first step in the derivation of the general clock signal Fourier series is to plot out one complete cycle of the periodic waveform to be modeled, such as is shown in FIG. 2. To increase the flexibility of the model and match the degrees of freedom provided in Spice, the following time-domain aspect parameters are included:

$V_1$=the minimum voltage
$V_2$=the maximum voltage
T=the period
$\tau_r$=the risetime
$\tau_f$=the falltime
$t_r$=the rising edge jitter
$t_f$=the falling edge jitter Other time-domain aspects however are possible.

To facilitate the Fourier series calculation, the waveform is separated into four segments where boundaries a-d, which will later serve as the limits of integration, are defined to be:

$$a = -\frac{T}{4} - \frac{\tau_r}{2} - t_r$$

$$b = -\frac{T}{4} + \frac{\tau_r}{2} - t_r$$

$$c = +\frac{T}{4} - \frac{\tau_f}{2} - t_f$$

$$d = +\frac{T}{4} + \frac{\tau_f}{2} - t_r$$

The standard Fourier expression into which the calculated transform coefficients will be inserted is as follows:

$$C(t) = A_0 + \sum_{n=1}^{\infty} A_n \cos\left(\frac{2n\pi}{T}t\right) + B_n \sin\left(\frac{2n\pi}{T}t\right)$$

where C(t)=the clock waveform, t=the timing instant, T=the period, and n=the integer multiple frequency (harmonic).

The transform coefficients $A_o$, $A_n$, and $B_n$ are found by computing the following integrals in Equations 1 below:

$$A_0 = \frac{1}{T}\left[\frac{V_2-V_1}{\tau_r}\int_a^b \left(x+\frac{T}{4}+\frac{\tau_r}{2}+t_r\right)dx + V_2\int_b^c dx + \frac{V_1-V_2}{\tau_f}\int_c^d \left(x-\frac{T}{4}-\frac{\tau_f}{2}+t_f\right)dx\right]$$ EQUATIONS 1

-continued $$A_n = \frac{2}{T}\left[\frac{V_2-V_1}{\tau_r}\int_a^b \left(x+\frac{T}{4}+\frac{\tau_r}{2}+t_r\right)\cos\left(\frac{n\pi x}{T}\right)dx + V_2\int_b^c \cos\left(\frac{n\pi x}{T}\right)dx + \frac{V_1-V_2}{\tau_f}\int_c^d \left(x-\frac{T}{4}-\frac{\tau_f}{2}+t_f\right)\cos\left(\frac{n\pi x}{T}\right)dx\right]$$

$$B_n = \frac{2}{T}\left[\frac{V_2-V_1}{\tau_r}\int_a^b \left(x+\frac{T}{4}+\frac{\tau_r}{2}+t_r\right)\sin\left(\frac{n\pi x}{T}\right)dx + V_2\int_b^c \sin\left(\frac{n\pi x}{T}\right)dx + \frac{V_1-V_2}{\tau_f}\int_c^d \left(x-\frac{T}{4}-\frac{\tau_f}{2}+t_f\right)\sin\left(\frac{n\pi x}{T}\right)dx\right]$$

The integrands in the above expressions are simply the set of functions which numerically describe the various segments of the waveform. By initially setting $V_1$ to zero, all computations corresponding to the region outside the boundaries a and d are avoided. Any non-zero $V_1$ value is later added to the computed value of $A_0$ to account for DC offset.

The resulting expressions for $A_0$, $A_n$, and $B_n$ are set forth in Equations 2 below:

$$A_0 = \frac{V_2-V_1}{2}\left(1+\frac{2(t_r-t_f)}{T}\right)+V_1$$ EQUATIONS 2

$$A_n = \frac{AT}{n^2\pi^2\tau_r}\sin\left(\frac{n\pi\tau_r}{T}\right)\left[\cos\left(\frac{n\pi}{2}\right)\sin\left(\frac{2n\pi t_r}{T}\right)+\sin\left(\frac{n\pi}{2}\right)\cos\left(\frac{2n\pi t_r}{T}\right)\right] - \frac{AT}{n^2\pi^2\tau_f}\sin\left(\frac{n\pi\tau_f}{T}\right)\left[\cos\left(\frac{n\pi}{2}\right)\sin\left(\frac{2n\pi t_f}{T}\right)-\sin\left(\frac{n\pi}{2}\right)\cos\left(\frac{2n\pi t_f}{T}\right)\right]$$

$$B_n = \frac{AT}{n^2\pi^2\tau_r}\sin\left(\frac{n\pi\tau_r}{T}\right)\left[\cos\left(\frac{n\pi}{2}\right)\cos\left(\frac{2n\pi t_r}{T}\right) - \sin\left(\frac{n\pi}{2}\right)\sin\left(\frac{2n\pi t_r}{T}\right)\right] - \frac{AT}{n^2\pi^2\tau_f}\sin\left(\frac{n\pi\tau_f}{T}\right)\left[\sin\left(\frac{n\pi}{2}\right)\sin\left(\frac{2n\pi t_f}{T}\right) + \cos\left(\frac{n\pi}{2}\right)\cos\left(\frac{2n\pi t_f}{T}\right)\right]$$

Figure 3A:
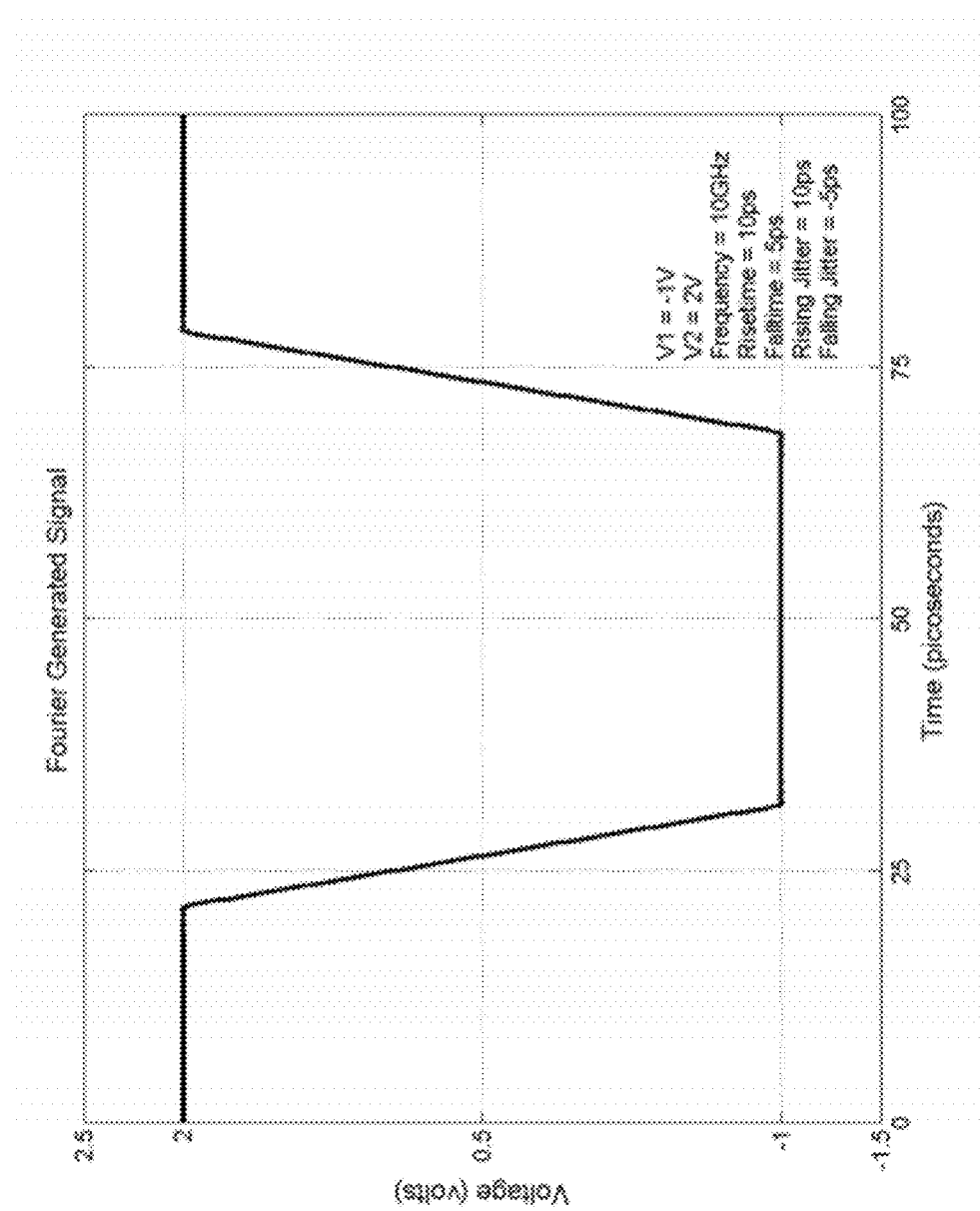
FIG. 3A illustrates a single cycle of a generated waveform demonstrating many degrees of freedom provided by the derived Fourier series.

Once the Fourier coefficients have been computed, a time-domain representation of the signal is constructed through the IFFT. FIG. 3A presents one complete cycle of a clock waveform generated with the first 100 harmonics of the Fourier series and based on the following parameters:

$V_1$=−1.0 V
$V_2$=2.0 V
f=1/T=10 GHz
$\tau_r$=10 ps (risetime)
$\tau_f$=5 ps (falltime)
$t_r$=10 ps (early rising edge jitter)
$t_f$=−5 ps (late falling edge jitter)

FIGS. 3B and 3C zoom in on the rising and falling edges of the signal to verify the accuracy of the generated waveform. While the period, minimum and maximum voltages, risetime, and falltime are all easily observed to be correct, the jitter terms require some explanation. In this example, a duty cycle of 50% would result in falling and rising edge crossings at 25 ps and 75 ps respectively. The figure clearly shows the falling edge crossing to occur at 30 ps (5 ps late), corresponding to the desired jitter of −5 ps, while the rising edge crossing occurs at 65 ps (10 ps early), corresponding to the desired jitter of +10 ps.

It should be noted that while the model just derived represents the rising and falling transitions of the signal through ideal linear ramping, any function express-able in closed-form that would more accurately emulate the shape of true signal transitions could be incorporated into the model by replacing the ramps and integrating the new function over the same limits along the time axis.

Then based on the current form of the parameterized Fourier series, or an alternative expression accounting for more realistic signal transitions, two diverging yet attractive paths become available. Depending upon the nature of the signal to be modeled, this underlying signal generation methodology may be employed to either enhance the efficiency of simulating signal-system interaction, or it may be used to construct signals with unconstrained voltage noise and timing jitter characteristics.

Enhanced Clock Simulation Efficiency:

As was discussed previously, computing the interaction of a signal with its environment can be mathematically carried out either through convolution or Fast Convolution, in which the frequency content of the signal is scaled by the frequency response of the system through which it is passing.

Because the Fourier series just derived provides the exact harmonic components of the clock signal, even more efficiency may be obtained during the simulation process. By limiting the number of sinusoidal components of the signal, the frequency representation reduces to a set of scaled delta functions located at the harmonic frequencies (i.e., the Fourier coefficients) as follows:

$$s(t)=A\sin(\alpha t)+B\sin(\beta t)+\ldots \Leftrightarrow S(\omega)=A\delta(\omega-\alpha)+B\delta(\omega-\beta)+\ldots$$

where s(t) and S($\omega$) are the time and one-sided frequency-domain representations of the signal.

Figure 4:
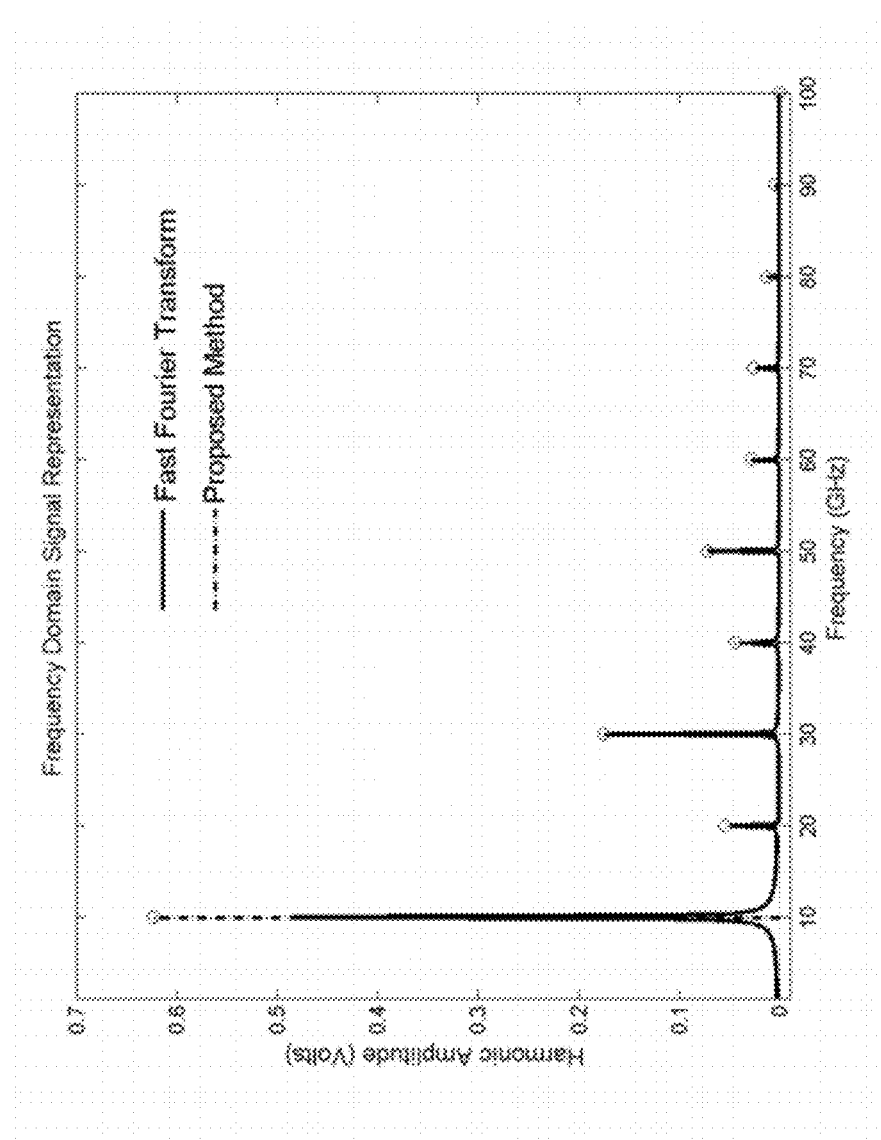
FIG. 4 illustrates a comparison of a signal frequency response calculated in PSpice through the FFT with the Fourier coefficients generated according to embodiments of the present invention.

This is important because the signal energy at all other frequencies in the spectrum is zero. Many circuit simulators are not equipped to recognize the periodic nature of an incoming signal and hence compute the Fourier transform by means of the FFT. Unfortunately, the finite number of points in such signals results in windowing effects during the FFT process. Rather than producing the true frequency response as a set of delta functions, the calculated response will exhibit a noise floor with spikes at the harmonic frequencies. FIG. 4 compares the representation of the first 10 harmonic components of a 10 GHz clock signal. In one case, the FFT was computed in PSpice, while in the other case, the component values were taken directly from the Fourier coefficients calculated in the signal generation process pursuant to embodiments of the technique just described. Two important distinctions are illustrated in the figure: first, the spreading at the base of the 10 GHz harmonic on the FFT curve, a manifestation of the finite data windowing effects, is compensated for by a decrease in the corresponding peak value; second, the existence of non-zero values in between the harmonic frequencies requires a complete point-to-point multiplication of the signal and channel responses during the simulation to avoid a loss of information.

While the number of multiplications associated with direct convolution and the Fast Convolution method scale with the length of the signal and the length of the channel impulse response, the number of multiplications in the proposed method, up until the point of time-domain signal reconstruction, is set by the number of harmonics in the Fourier representation of the signal and does not increase for longer signals or more complicated channel frequency responses. In fact, if the transfer function of the channel is known, the magnitudes of the resulting wave's sinusoidal components are found with the following simple formula:

$$|H(\omega)|\times[A\delta(\omega-\alpha)+B\delta(\omega-\beta)+\ldots]=A|H(\omega)|_{\omega=\alpha}+B|H(\omega)|_{\omega=\beta}+\ldots$$

where H($\omega$) equals the frequency response of the channel and the remaining terms represent the sinusoidal components of the transmitted signal. In other words, the resulting signal components are computed by scaling the heights of the signal coefficient delta functions by the evaluated magnitude of the channel frequency response at the corresponding harmonic frequencies. In terms of signal phase changes, the phase of the resulting sinusoids may similarly be found by:

$$\angle H(\omega)\times[\delta(\omega-\alpha)+\delta(\omega-\beta)+\ldots]=\angle H(\omega)|_{\omega=\alpha}+\angle H(\omega)|_{\omega=\beta}+\ldots$$

After the scaling process, the resulting magnitudes and phases may then be used to reconstruct the channel-modified signal. Thus with the exception of modeling the incoming signal with a truncated Fourier series, the process of computing the signal-channel interaction is carried out through simple steady-state analysis.

If a measured frequency response (S-parameters, etc.) is used rather than a closed-form transfer function expression, these formulas will only change in the sense that the magnitude and phase multipliers of the channel response will be found by indexing the magnitude and phase data points corresponding to the appropriate frequencies.

Of course, the number of harmonics included in the simulation impacts to the accuracy of the result. In the high-speed interconnect environment, the band-limitations of the lossy channel tend to suppress higher order harmonics, and simulations incorporating 50 harmonic components generally produce excellent matching to the exact signal function.

In comparing the computational demands of the proposed method with the convolution-based approaches previously described, the new method requires 2k+1 steps to calculate the initial Fourier coefficients (a single DC component, k sine components, and k cosine components), with k being the number of harmonics included in the series. This is followed by 2k+1 steps to calculate the effect of the channel on the magnitudes of the Fourier components and an additional 2k+1 steps to calculate the associated phase effects. Generating the final time-domain representation of the signal from the scaled Fourier coefficients may be done in two ways: first, the various sinusoids may be generated and then summed together, a process which adds an additional (2k+1)N computational steps; or the Fourier coefficients may be fed directly to the IFFT process, adding only N $\log_2$ N steps. The latter method will be more efficient when the number of harmonics (k) is greater than ($\log_2$ N−1)/2, which is generally the case. Combining the number of computations for the entire process leads to:

$$\text{No. Steps(Proposed Method)}=3(2k+1)+N\log_2 N$$

where k equals the number of harmonics in the finite Fourier series.

For two signals with 1000 data points each, and a Fourier representation including 100 harmonics, an embodiment of the disclosed technique requires 7,511 steps, compared with 4,670,669,001 and 103,424 for direct and Fast Convolution respectively.

To verify the positive effect on simulation time, a simulation was constructed in which the impact of a first order lowpass filter on 100, 200, and 300 cycles of a passing clock signal was computed through Fast Convolution and the disclosed technique. With the simulation time step fixed at 50 fs, the simulations were completed with Matlab 6.5 running on a 900 MHz Pentium III desktop. The results reported in Table 1 reflect the computational requirements up to and including the calculation of the frequency domain representation of the filtered signal. The additional $N \log_2 N$ steps incurred by both methods during time-domain signal reconstruction were intentionally excluded to better distinguish between the performance and efficiency of the two techniques.

TABLE 1

|  | No. Cycles | Simulation Time (sec) | Memory (MB) |
| --- | --- | --- | --- |
| Proposed Method | 100 | 7 | 3.2 |
| Fast Convolution | 100 | 7 | 21.6 |
| Proposed Method | 200 | 7 | 3.2 |
| Fast Convolution | 200 | 25 | 49.6 |
| Proposed Method | 300 | 7 | 3.2 |
| Fast Convolution | 300 | 27 | 54.4 |

While the allocated memory reported does not account for memory required by Matlab's internal functions, it does account for all variables and other memory usage accumulated during the simulation. As expected, the required memory and simulation time scaled with the number of signal cycles for the Fast Convolution approach, but no scaling occurred with the newly proposed technique. By way of comparison, the direct convolution method required 20 seconds to simulate only 10 cycles of the same signal.

In addition to providing superior efficiency over longer simulation periods, the benefits of the proposed method are also enhanced with each additional stage through which the signal must pass, assuming linear operation is maintained through each. This is understood by considering that the number of additional computational steps associated with the proposed method is equal to the number of stages times the number of signal harmonics, while the increase incurred in the Fast Convolution process is equal to the number of stages times the average number of points in the FFTs of the stages' impulse responses. Harmonic Balance simulation time would also increase with more stages as the number of nodes in the system increases. A direct comparison of the disclosed technique with Harmonic Balance is not possible as that technique involves iteration rather than direct signal to channel multiplication in reaching the steady state solution and targets, as does the Circuit Envelope method, nonlinear as well as linear systems.

Unfortunately, many of the signal degrading components to be modeled are not periodic by nature, and therefore do not lend themselves to the proposed simulation methodology immediately. One such contributor to signal degradation is random jitter, which is typically assumed to approximate a Gaussian probability distribution. Many circuit designers, whose tool set is limited to Spice-like simulators, find that random noise can be approximated with a set of sinusoidal signals at independent and unrelated frequencies. As long as the frequencies of the various noise sources do not factor into one another or into the underlying signal being modeled, then they tend to combine to produce a relatively random waveform. Of course, it is very difficult to control the distribution of the noise and therefore this technique can not be used to produce a perfectly Gaussian distributed noise source. Nevertheless, it may be employed to observe the response of the system under test to nearly-Gaussian voltage and timing noise.

Even with such a crude approximation, designers must still wait for several cycles to simulate if they desire accuracy in characterizing random jitter in the time domain. But if the underlying signal is being generated from its Fourier components, as proposed, then the many sinusoids constituting the noise source may be handled just as the harmonics of the fundamental signal, being represented as delta functions and consequently shaped by the channel in exactly the same way. At the output of the system, the resulting signal may be reconstructed, including these additional noise components, and all of this can be done while only increasing the number of multiplication steps in the computation to account for the increased number of sinusoids making up the final signal.

It is important to point out that even when the sinusoidal noise components are added to the original clock signal, the waveform remains periodic, though its periodicity may now span multiple cycles, whereas the original clock signal, with or without DCD, repeated without variance at the frequency of the underlying clock. When the sinusoidal noise sources are chosen carefully, the resulting waveform comprising both the original clock and the noise may not repeat for hundreds or thousands of clock cycles. In fact, the waveform will not repeat until all of the harmonics return to their original phase simultaneously. That is why this technique can mimic the characteristics of random noise and jitter over a specified number of clock cycles.

For the purposes of this detailed description, waveforms which repeat with the frequency of the clock and waveforms which repeat after multiple clock cycles are respectively referred to as "purely periodic" and "periodic". In reality both sets of waveforms are purely periodic, but the distinction is drawn to better explain how adding periodic signals to the existing clock harmonics can produce the appearance of randomness. (At a later point in this detailed description, an additional set of aperiodic signals is described with reference to pseudo-random data streams.).

Figure 5:
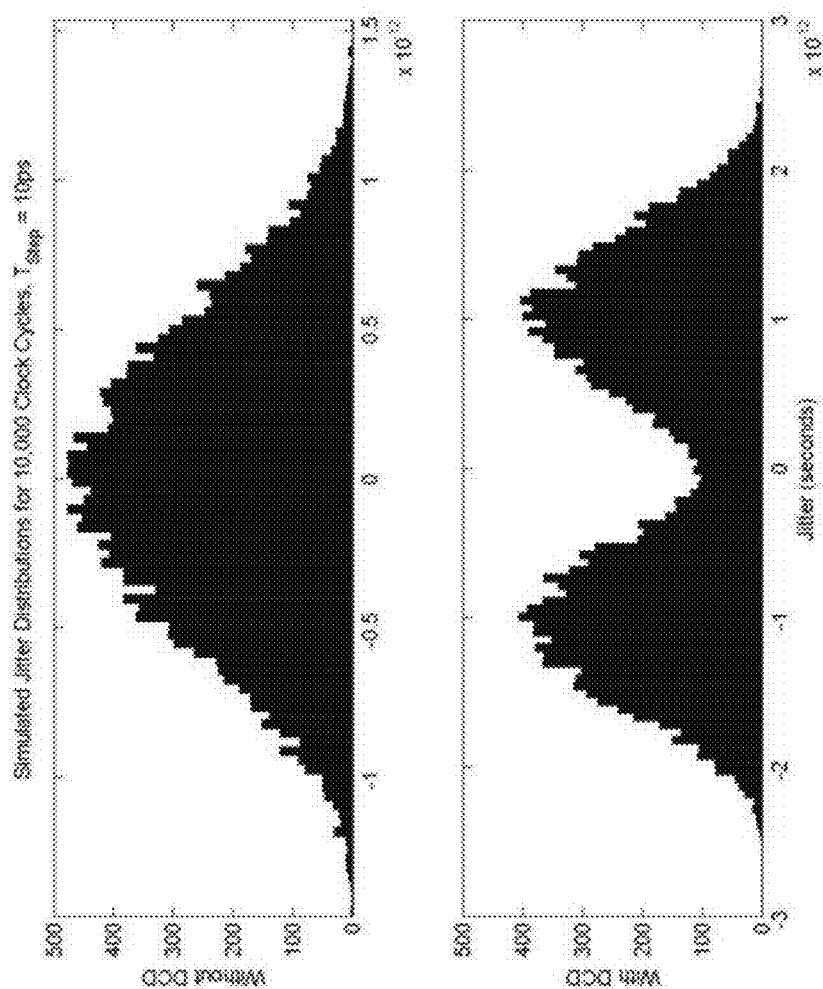
FIG. 5 illustrates random and deterministic jitter using embodiments of the present invention and a minimum time step of 10 ps, in which the upper portion displays the jitter distribution generated with a set of unrelated sinusoidal noise sources, and in which the lower portion adds 0.75 ps of duty cycle distortion (DCD) to the total jitter distribution.

To verify that random noise and jitter can be reasonably approximately with sinusoidal noise components, a set of 6 sinusoids was chosen between the frequencies of 1 GHz and 18 GHz to model a high frequency noise source. Their amplitudes were chosen to provide for approximately 0.4 $ps_{rms}$ of Gaussian distributed jitter. FIG. 5 presents the simulation results for a pair of 10 GHz clock signals, each with random jitter (derived from the 6 sinusoids) and one with an additional static phase offset DCD of 0.75 ps, passed through the same lowpass filter. The upper window displays the results for the signal with only random jitter, while the lower window presents the results for the signal with both random jitter and DCD. What makes these results impressive is that they were computed with a minimum time step of 10 ps. The large time step, while not affecting accuracy, allowed the simulation of 10,000 clock cycles to be computed in approximately 20 seconds, with the majority of that time attributed to the generation and plotting of the histograms.

Matlab's "rand( )" and/or "randn( )" functions may be used to generate sinusoidal noise sources with a controllable standard deviation in amplitude and randomness in frequency without reverting to deriving such a set of signals by hand. This would maintain the periodic nature of all frequency components in the process, allowing the noise to be treated as additional signal harmonics, while still leading to a better approximation of Gaussian white noise.

Figure 6:
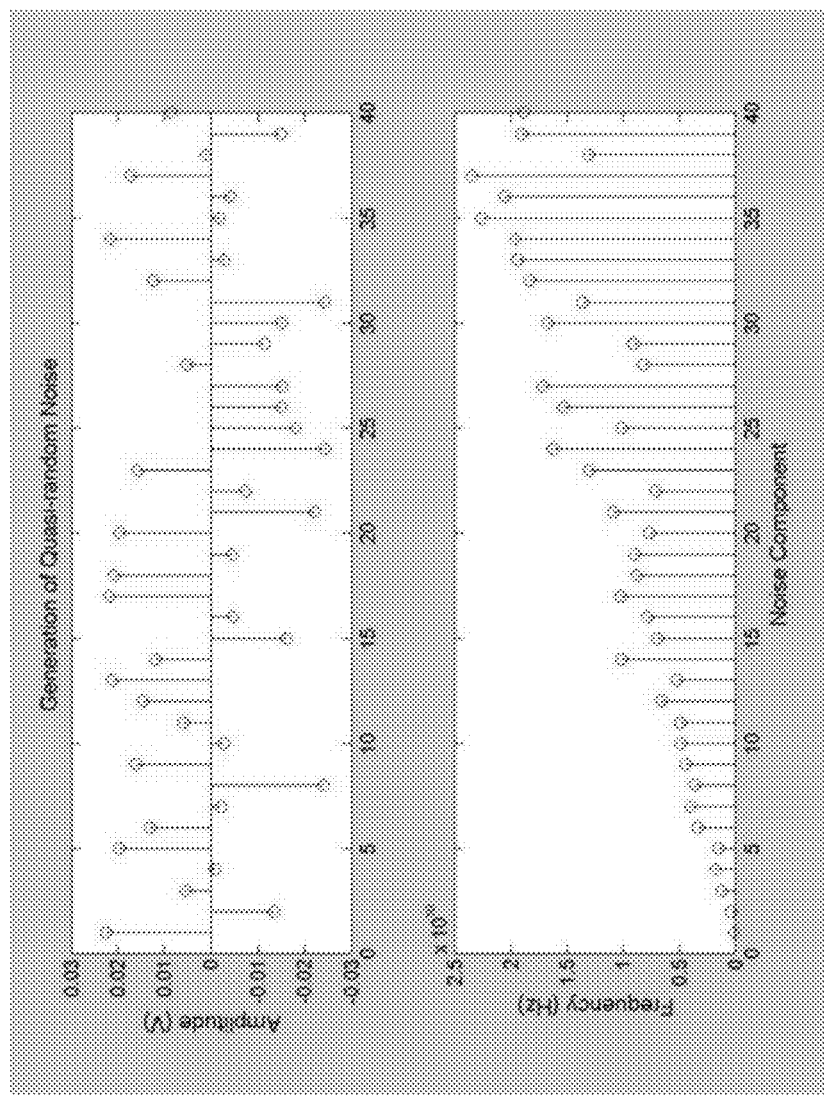
FIG. 6 illustrates 40 noise components generated using Matlab's "randn( )" command.
Figure 7:
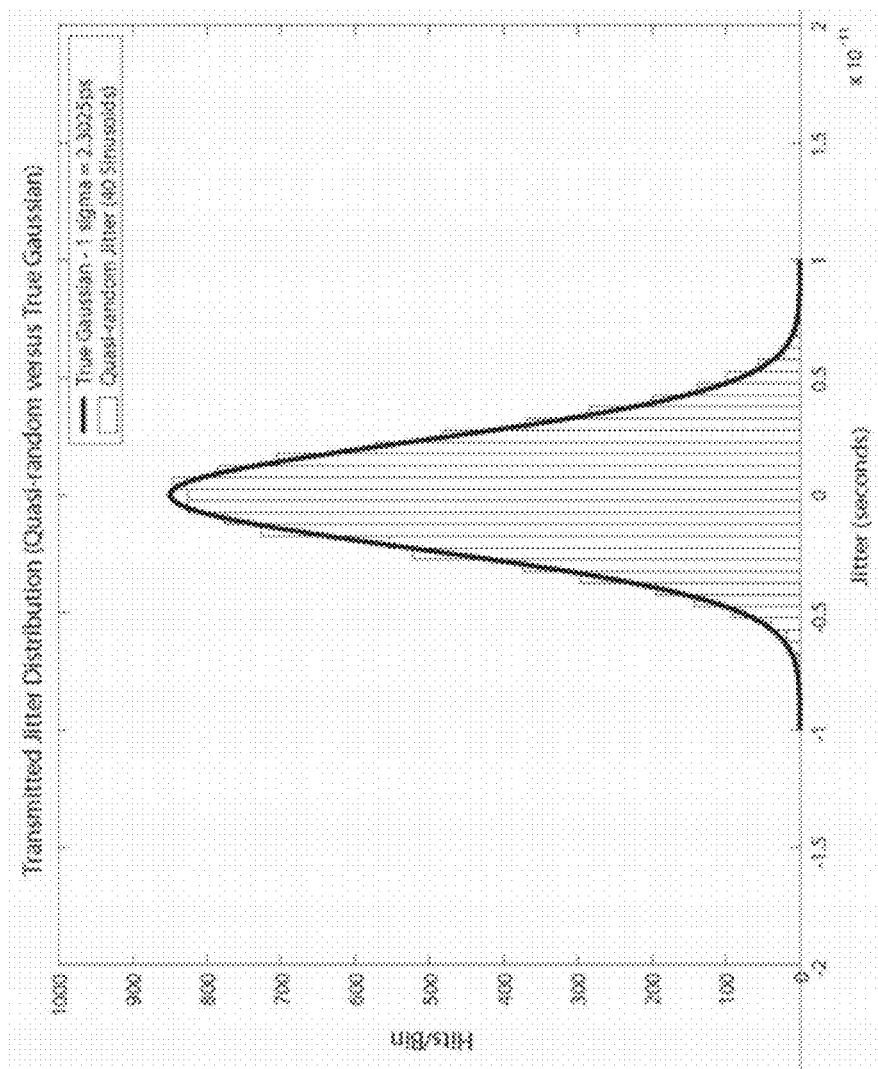
FIG. 7 illustrates simulated jitter using the noise components of FIG. 6 compared with a true Gaussian.

As an example, and as shown in FIG. 6, a set of 40 sinusoidal noise sources was generated in Matlab spanning the frequency spectrum from DC to nearly 25 GHz (frequencies expected to contribute to the output signal based on the known system response). Initially the frequencies were determined by specifying that Matlab select the number of desired signals along a logarithmic scaling of the required spectrum. To avoid signal beating, which occurs when two or more signals have a common multiple, the selected frequencies were modified with a random frequency offset generated with the "rand( )" function. To obtain nearly Gaussian distributed noise, the amplitudes of the 40 sinusoids were generated with the "randn( )" function. Translation of the rms noise voltage to the expected rms jitter is achieved by dividing the voltage noise by the slope of the signal transition, as mentioned previously. FIG. 7 compares the resulting simulated jitter histogram and a true Gaussian curve with the same mean and standard deviation, illustrating that the technique provides a good approximation.

Even when the proposed simulation methodology of computing the signal-channel interaction through straight multiplication of the signal harmonics and channel frequency response will not suffice, as may be the case when the impact of nonlinear circuit elements on the degradation of a passing signal must be accounted for, simulation efficiency of commercially available tools may still be improved when the internal signals provided by the simulator are replaced with signals generated through the proposed technique. This is because the summation of the harmonic components in the time domain leads to timing precision far below the fundamental time step of the waveform yet still trackable by the simulator.

Simulations have been run in which static timing offsets on the order of $10^{-23}$ seconds were generated and visible even when the fundamental time step of the time-voltage vector representing the signal was $50 \times 10^{-15}$ seconds. In fact, the precision of the waveform timing is only constrained by the numerical limits of the simulator. All of these details imply that a signal generated through this technique may be passed through the commercial simulator with a larger time step, thereby lowering the simulation time and simulator memory requirements.

Before discussing additional advantages made possible through adopting embodiments of the described signal generation techniques, an algorithm for efficient computation of signal-system interaction is summarized:
(1) Based on the estimated channel frequency response, select the number of signal harmonics to carry through the computation;
(2) Using Equations 2, calculate the magnitudes and frequencies of the Fourier components of the desired waveform;
(3) Periodic noise such as DCD may be added and modified through a variation in the underlying Fourier series;
(4) Quasi-random noise may be added through an additional set of sinusoids at carefully chosen, unrelated frequencies;
(5) Scale the sinusoids of the Fourier series and noise by the magnitude of the channel transfer function evaluated at the corresponding harmonic frequencies;
(6) Shift the sinusoids of the Fourier series by the phase angle of the channel transfer function evaluated at the corresponding harmonic frequencies; and
(7) Reconstruct the signal from the resulting set of Fourier components through the IFFT.

Unconstrained Waveform Generation:

Another application facilitated by the proposed signal generation technique is the derivation of periodic and aperiodic signals with unconstrained control over voltage and timing characteristics.

Because the IFFT returns only one time-domain cycle for a given set of Fourier coefficients, rather than copy that one cycle over and over to produce a purely periodic waveform, allowing for the enhanced simulation efficiency just discussed, several different cycles may be generated and pieced together to provide a more realistic transmitted signal. Thus, the transition terms $t_r$ and $t_f$ from Equations 2 may be considered as random variables and a new set of Fourier coefficients may be calculated for each cycle, implying that both deterministic and random jitter may be completely controlled during the waveform generation. When implemented in Matlab, the formation of 100-1000 jittery clock cycles takes 3-4 seconds, though the signal generation time grows proportional to the product of the number of cycles and the number of harmonics incorporated into each cycle.

Figure 8:
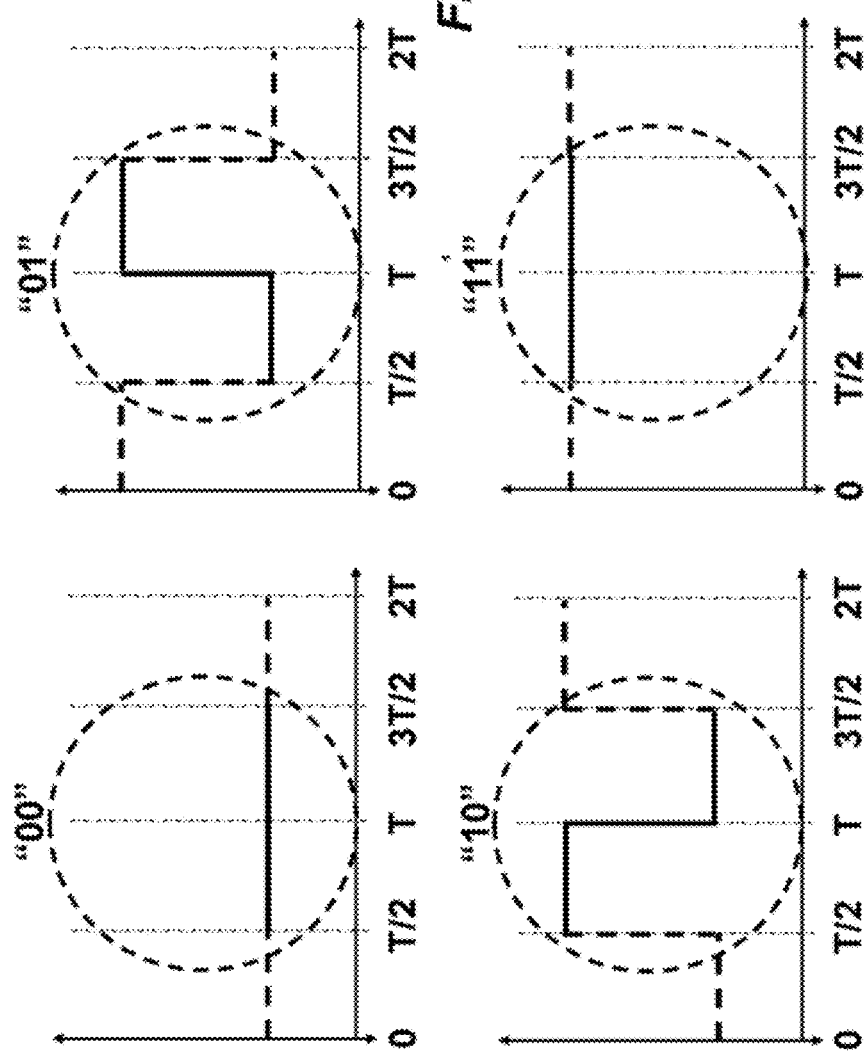
FIG. 8 illustrates four possible data symbols used to represent non-return-to-zero (NRZ) signaling in a data bit stream.

Fourier-Based Data Signal Generation:

In the same way that several cycles with varied timing parameters at each edge may be pieced together to form a jittery clock signal, several distinct data symbols may be pieced together to produce a random data waveform, though the aperiodicity of random data adds complexity to the derivation. Rather than computing the Fourier series for a single periodic waveform, each transition and binary state of the desired signal requires a separate symbol to insure continuity at each cycle edge. FIG. 8 presents the four symbols needed to simulate binary non-return-to-zero (NRZ) data, where "00" denotes two consecutive transmitted zeros; "01" denotes a zero followed by a one; "10" denotes a one followed by a zero; and "11" denotes two consecutive transmitted ones.

The Fourier series derivation is then very similar to what was carried out for the clock signal. While the "00" and "11" symbols are trivial, expressions for the parameterized Fourier coefficients of the "01" and "10" symbols must be computed. To overcome the aperiodic nature of each data symbol, the Fourier series is calculated assuming periodicity. Because the IFFT process returns one cycle at a time, the data waveform may be pieced (concatenated) together not only with specific edge information defined for each cycle, as was the case with the clock, but the symbol itself may also change from cycle to cycle. Thus, once the desired bit stream has been encoded with these four symbols, the data signal is pieced together without discontinuity.

It should be noted that this technique is not limited to the formation of NRZ data signals, but may be expanded to other forms of data encoding (e.g. RZ (return-to-zero), 4-PAM (pulse amplitude modulation), PSK (phase-shift keying), Manchester, Duobinary, etc.), though most other encoding schemes will require more than the four symbols needed to represent standard NRZ data.

Signal Generation Summary:

From the detailed description presented in the preceding sections, an embodiment for generating realistic clock and data signals with controllable noise and jitter characteristics can be described as:
(1) Based on the desired jitter distribution, generate a vector of timing values representing the jitter at each sequential edge;
(2) Based on the estimated channel frequency response or system bandwidth, select the number of signal harmonics to carry through the computation;
(3) If generating a clock, use Equations 2 to calculate the magnitudes and frequencies of the Fourier components of each cycle, convert to the time domain through the IFFT, and piece the cycles together;
(4) If generating data, encode the bit stream using the four symbols shown in FIG. 8 and then use a similar set of equations to calculate the magnitudes and frequencies of the Fourier components of each cycle, convert to the time domain through the IFFT, and piece the cycles together; and
(5) Based on the desired voltage noise distribution, generate a vector of voltage values representing the noise at each time step and add these noise values to either the clock or data signals at the corresponding step in time.

Figure 9:
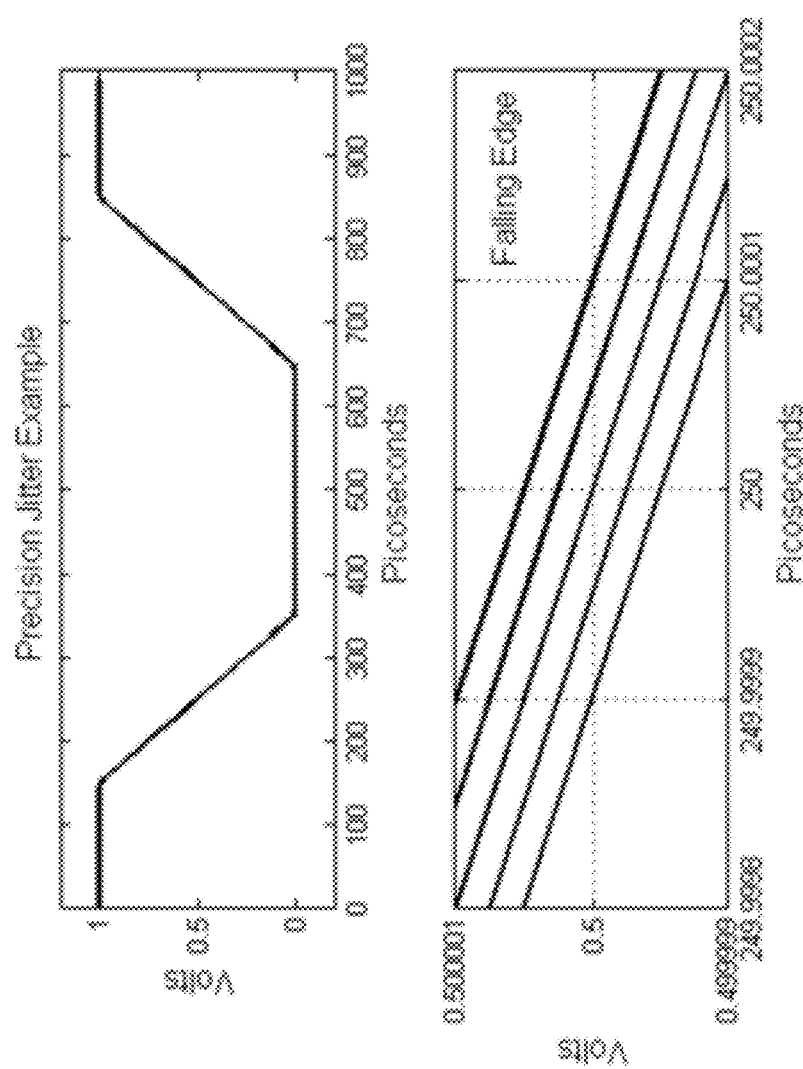
FIG. 9 illustrates a 1 GHz clock waveform generated through embodiments of the present invention, and further illustrates the precision of jitter generation, such that a time axis step of 10 ps creates a jitter resolution of at least 0.5 fs.

Verification:

To verify the precision of one method embodiment of the present invention, in terms of jitter resolution and distribution approximation, several Matlab simulations were completed. In FIG. 9, five 10 GHz clock cycles were simulated with specified jitter (each cycle constructed from 50 harmonic components). For edges 1-5, best shown in the lower portion of FIG. 9, the designated jitter magnitudes were $-1 \times 10^{-15}$, $-0.5 \times 10^{-15}$, 0, $0.5 \times 10^{-15}$, and $1 \times 10^{-15}$ seconds. The upper window of the figure presents the superposition of the five clock cycles. By zooming in on the falling edge it is not only possible to distinguish the five edges, but it is observed that the edges cross the midway point with the designated timing. It is important to note that the underlying code plots these signals out with 100 time steps per cycle. In other words, the simulation demonstrates a resolution of better than $0.5 \times 10^{-15}$ seconds with a simulated time step of $10^{-11}$ seconds.

Figure 10:
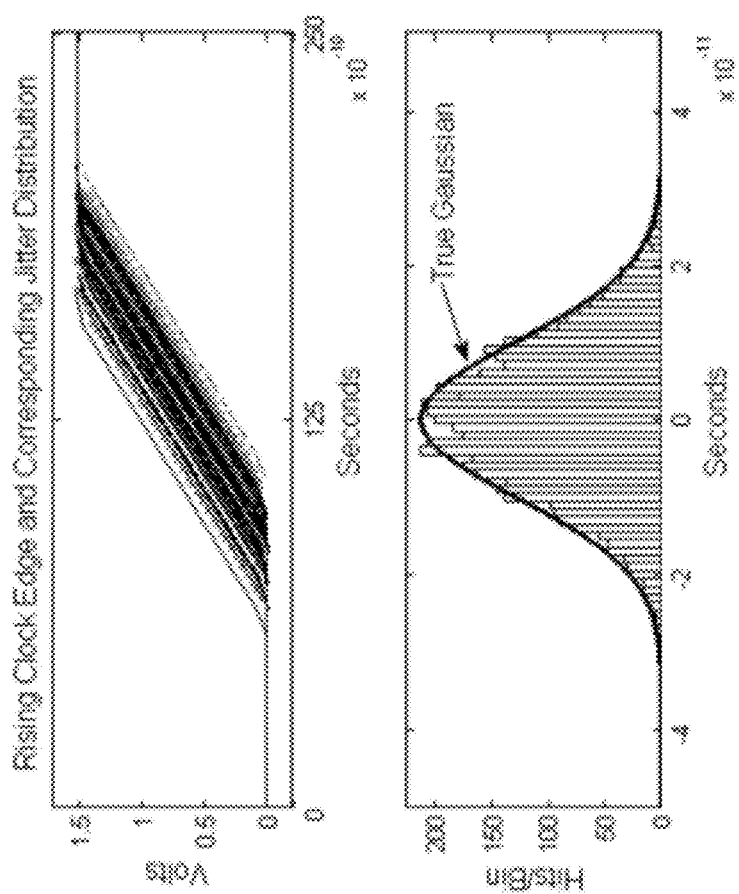
FIG. 10 illustrates jitter generated in the signal to be simulated pursuant to a disclosed embodiment of the invention in comparison to an ideal theoretical jitter distribution.
Figure 11:
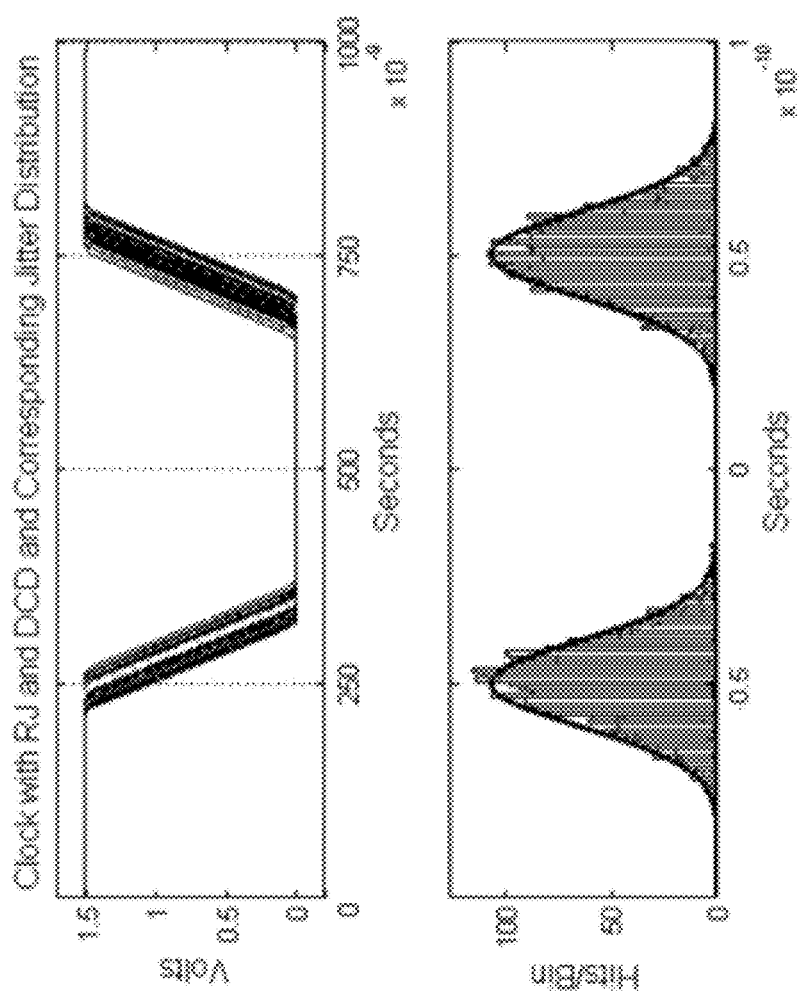
FIG. 11 illustrates jitter generated in a signal such as shown in FIG. 10, with added DCD.
Figure 12:
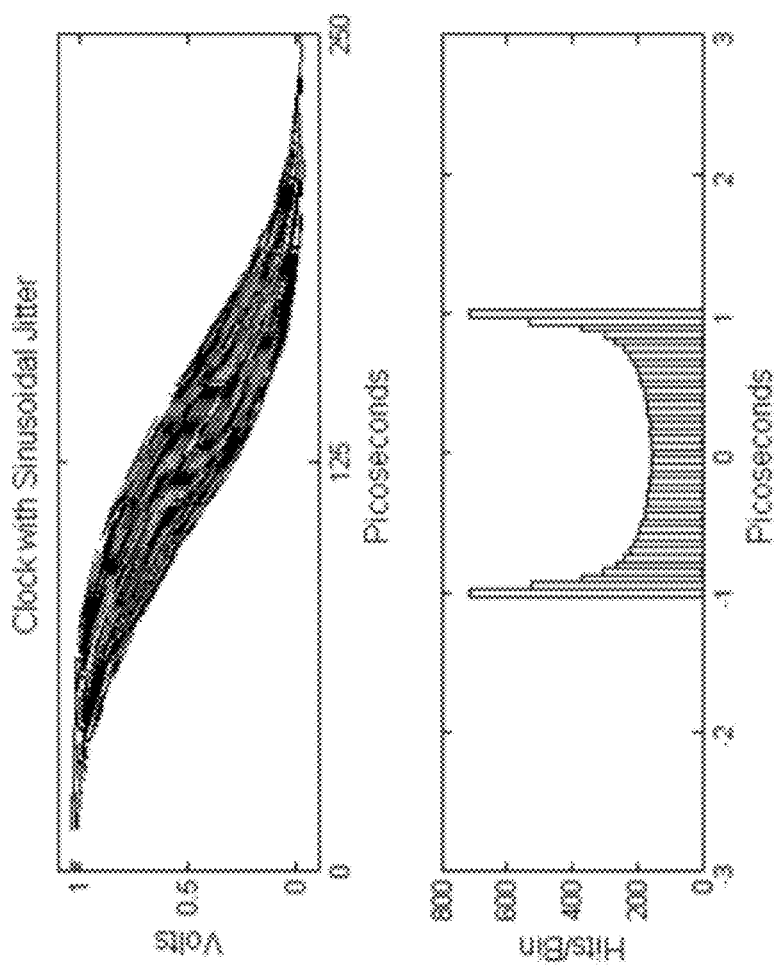
FIG. 12 illustrates sinusoidal jitter generated in the signal to be simulated pursuant to a disclosed embodiment of the invention.

FIGS. 10-12 demonstrate the ability of embodiments of the described techniques to approximate specific jitter distributions. In FIG. 10, a signal was generated to exhibit only Gaussian distributed jitter. After producing the signal, the edge timing was extracted and binned in the histogram shown. A true Gaussian curve was then overlaid for comparison. In FIG. 11, the random jitter was combined with 50 ps of DCD and the true distribution was again superimposed. FIG. 12 displays the jitter distribution extracted from a signal generated with a sinusoidal (i.e., deterministic) jitter component.

As a side note, not only does the ability to simulate sinusoidal jitter provide an additional degree of freedom in signal modeling, but it also proves useful in the characterization of core communication circuits, such as PLLs and delay-locked loops (DLLs). Typical analysis of PLL and DLL control loops consists of applying a static offset between the phase of the input signal and a reference phase provided by a voltage controlled oscillator (VCO) in the case of a PLL or a voltage controlled delay line (VCDL) in the case of a DLL, and then observing the convergence of the control signal as the phase offset is minimized. This technique provides information regarding the overshoot, settling time, and stability of the control loop.

In a realized system, however, the phase offset between the input signal and the reference signal will vary continuously as both the oscillator and the delay line contribute additional jitter to the equation. In the case of the PLL's VCO, small drifts in the free-running oscillator frequency may manifest themselves as sinusoidal-like jitter at the circuit output. In addition, that jitter accumulates until the control signal offers compensation, resulting in a phenomena referred to as jitter peaking. By employing a VCDL rather than a VCO, the DLL avoids significant jitter accumulation, but still displays a moderate translation of power supply noise to output jitter as a result of delay element sensitivity. Thus to truly model the phase-locking and tracking ability of PLLs and DLLs requires the application of signals with continuously varying phase, including sinusoidal variation, at the circuit input. Only in this way can the true jitter transfer and jitter peaking of the circuits be quantified.

Figure 13:
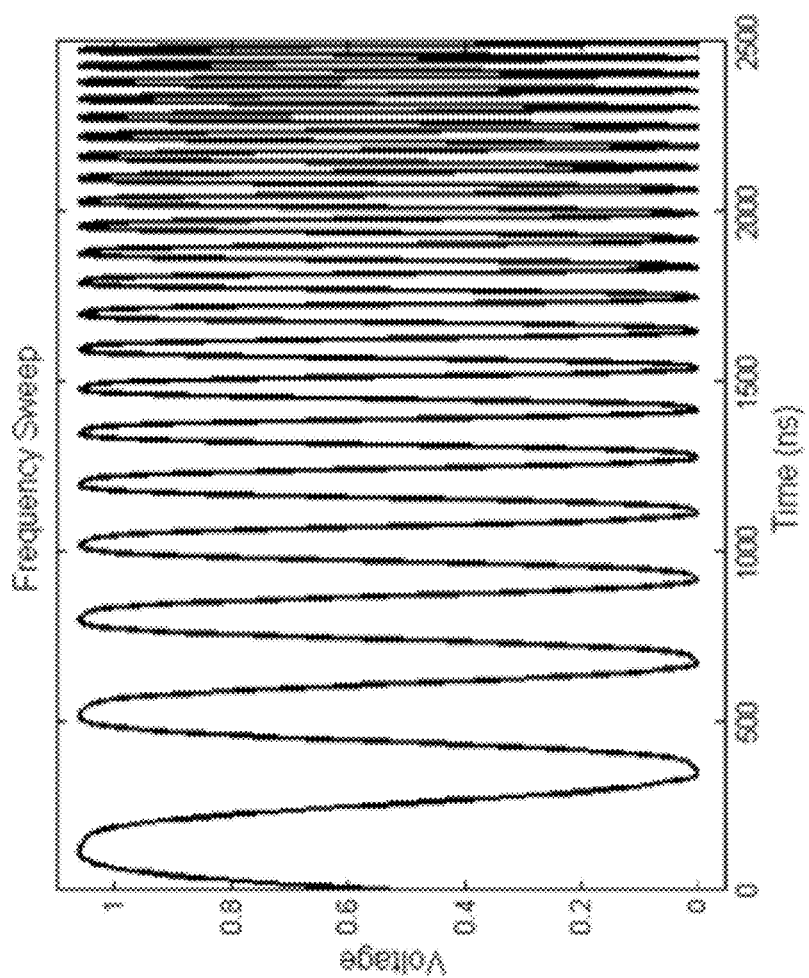
FIG. 13 illustrates a frequency-modulated signal generated from Fourier coefficients pursuant to a disclosed embodiment of the invention.

Along these same lines, to provide an even more accurate representation of PLL behavior requires an accounting for the oscillator frequency drift. Simple modulation of the reference signal's frequency is accomplished by specifying the period (T) of each cycle during the initial signal generation process. FIG. 13 presents a frequency modulated signal derived from Fourier components, where the cycle-to-cycle frequency variation follows a linear ramp. Applying a signal of this form to the input of a PLL or DLL should facilitate the measurement of the phase-locking and frequency-tracking performance.

Jitter Injection:

To inject jitter into an existing signal with both time and voltage dimensions is complicated. One embodiment for executing this operation is to:

(1) Measure the mean "0" and "1" values of the existing signal;
(2) Measure the mean risetime and falltime of the existing signal;
(3) Extract the transition timing of the existing signal. This might be done by interpolating when the signal crosses a designated threshold;
(4) Derive a second signal whose voltage swing was determined in step one, whose risetime and falltime were found in step two, whose initial phase is in sync with the mean phase of the original jittery signal, and whose jitter characteristics represent the additive jitter; and
(5) Scale the two signals by a factor of ½ and then use vector addition to combine them. Steps one and two minimize the reshaping of the original signal during this averaging process.

Figure 14:
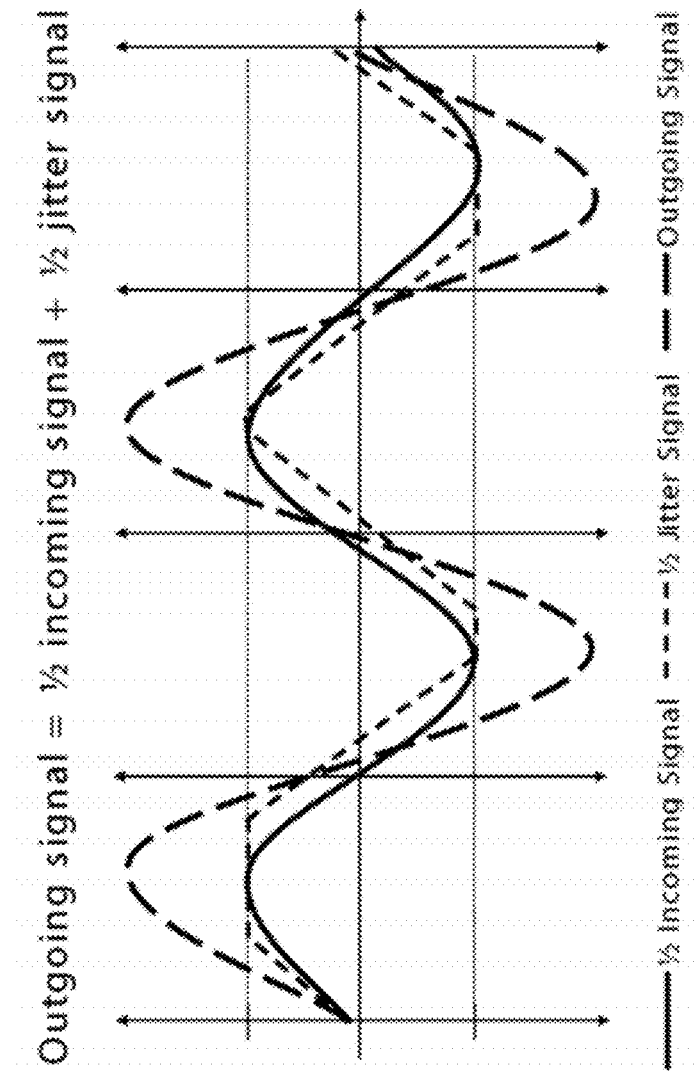
FIG. 14 illustrates a method of injecting jitter in an existing signal pursuant to a disclosed embodiment of the invention.

This procedure is illustrated in FIG. 14. As can be seen, at some edges the injected jitter adds constructively to the total timing deviation of the transition, while at other edges it may reduce the final jitter value.

Finally, in the same way that the signal's edge timing and period can be treated as variables and adjusted from cycle-to-cycle, so too can the amplitude and common-mode level of the signal be varied. This added functionality allows for the simulation of common-mode signal drift and also facilitates standard measurements, such as the input common-mode range of differential circuits.

Hardware/Software Considerations and Implementations:

One skilled in the art will realize that the disclosed techniques are usefully implemented as software running on a computer system, and ultimately stored in a computerized-readable media, such as a disk, semiconductor memory, or other media discussed below. Such a computer system can be broadly construed as any machine or system capable or useful in reading and executing instructions in the software program and making the various computations embodiments of the disclosed techniques require. Usually, embodiments of the disclosed techniques would be implemented as programs installable on a circuit designer's workstation or work server. Moreover, embodiments of the disclosed techniques can easily be incorporated into pre-existing circuit simulation software packages, such as those mentioned previously.

Figure 15:
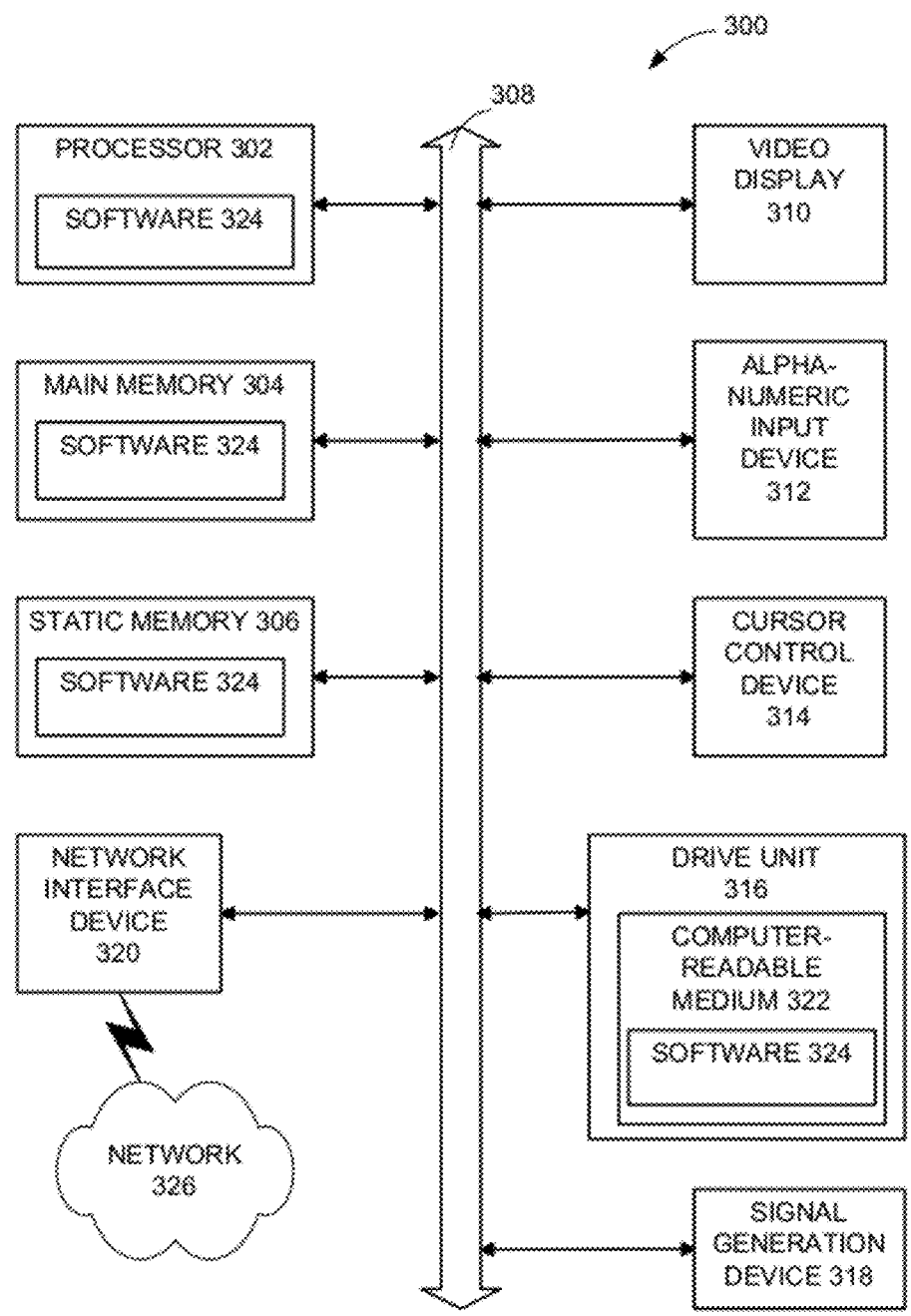
FIG. 15 illustrates a computer system in which disclosed embodiments of the disclosed techniques may be implemented, and illustrates the embodiment of the techniques in computer-readable media.

FIG. 15 is a block diagram of an exemplary computer system 300 within which a set of instructions, for causing the machine to perform any one or more of the techniques described herein, may be executed. In alternative embodiments, the computer system 300 operates as a standalone device or may be connected (e.g., networked) to other computer systems. In a networked deployment, the system 300 may operate in the capacity of a server or a client machine in a server-client network environment, or as a peer machine in a peer-to-peer (or distributed) network environment. The computer system 300 may be a personal computer (PC), a workstation such as those typically used by circuit designers, a set-top box (STB), a Personal Digital Assistant (PDA), a cellular telephone, a web appliance, a network router, switch or bridge, or any machine capable of executing a set of instructions that specify actions to be taken by that machine, and networked versions of these.

The exemplary computer system 300 includes a processor 302 (e.g., a central processing unit (CPU), a graphics processing unit (GPU) or both), a main memory 304 and a static memory 306, which communicate with each other via a bus 308. The computer system 300 may further include a video display unit 310 (e.g., a liquid crystal display (LCD) or a cathode ray tube (CRT)). The computer system 300 also includes an alphanumeric input device 312 (e.g., a keyboard), a user interface (UI) navigation device 314 (e.g., a mouse), a disk drive unit 316, a signal generation device 318 (e.g., a speaker) and a network interface device 320.

The disk drive unit 316 includes a computer-readable medium 322 on which is stored one or more sets of instructions and/or data structures (e.g., software 324) embodying embodiment of the various techniques disclosed herein. The software 324 may also reside, completely or at least partially, within the main memory 304 and/or within the processor 302 during execution thereof by the computer system 300, the main memory 304 and the processor 302 also constituting computer-readable media.

The software 324 and/or its associated data may further be transmitted or received over a network 326 via the network interface device 320 utilizing any one of a number of well-known transfer protocols (e.g., HTTP).

While the computer-readable medium 322 is shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding or carrying a set of instructions for execution by the machine and that cause the machine to perform any one or more of the methodologies of the disclosed techniques, or that is capable of storing, encoding or carrying data structures utilized by or associated with such a set of instructions. The term "computer-readable medium" shall accordingly be taken to include, but not be limited to, solid-state memories, optical and magnetic media such as discs, and carrier wave signals.

Embodiments of the disclosed techniques can also be implemented in digital electronic circuitry, in computer hardware, in firmware, in special purpose logic circuitry such as an FPGA (field programmable gate array) or an ASIC (application-specific integrated circuit), in software, or in combinations of them, which again all comprise examples of "computer-readable media." When implemented as software, such software can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network.

Processors 302 suitable for the execution of a computer program include, by way of example, both general and special purpose microprocessors, and any one or more processors of any kind of digital computer. Generally, a processor will receive instructions and data from a read-only memory or a random access memory or both.

To provide for interaction with a user, the invention can be implemented on a computer having a video display 310 for displaying information to the user and a keyboard and a pointing device such as a mouse or a trackball by which the user can provide input to the computer. Other kinds of devices can be used to provide for interaction with a user as well. For example, feedback provided to the user can be any form of sensory feedback, such as visual feedback, auditory feedback, or tactile feedback; and input from the user can be received in any form, including acoustic, speech, or tactile input.

Aspects of the disclose techniques can employ any form of communication network. Examples of communication networks 326 include a local area network ("LAN"), a wide area network ("WAN"), and the Internet.

Exemplary Computer-Implementable Methods

FIGS. 16A-16E set forth flow diagrams of certain embodiments of the disclosed techniques, which as just noted are most logically implemented in software on a computer system, and which are storable on any computer-readable media. Such embodiments are merely illustrative as embodiments of the various techniques disclosed herein, and should not be understood as summarizing all such techniques within the scope of this disclosure.

Figure 16A:
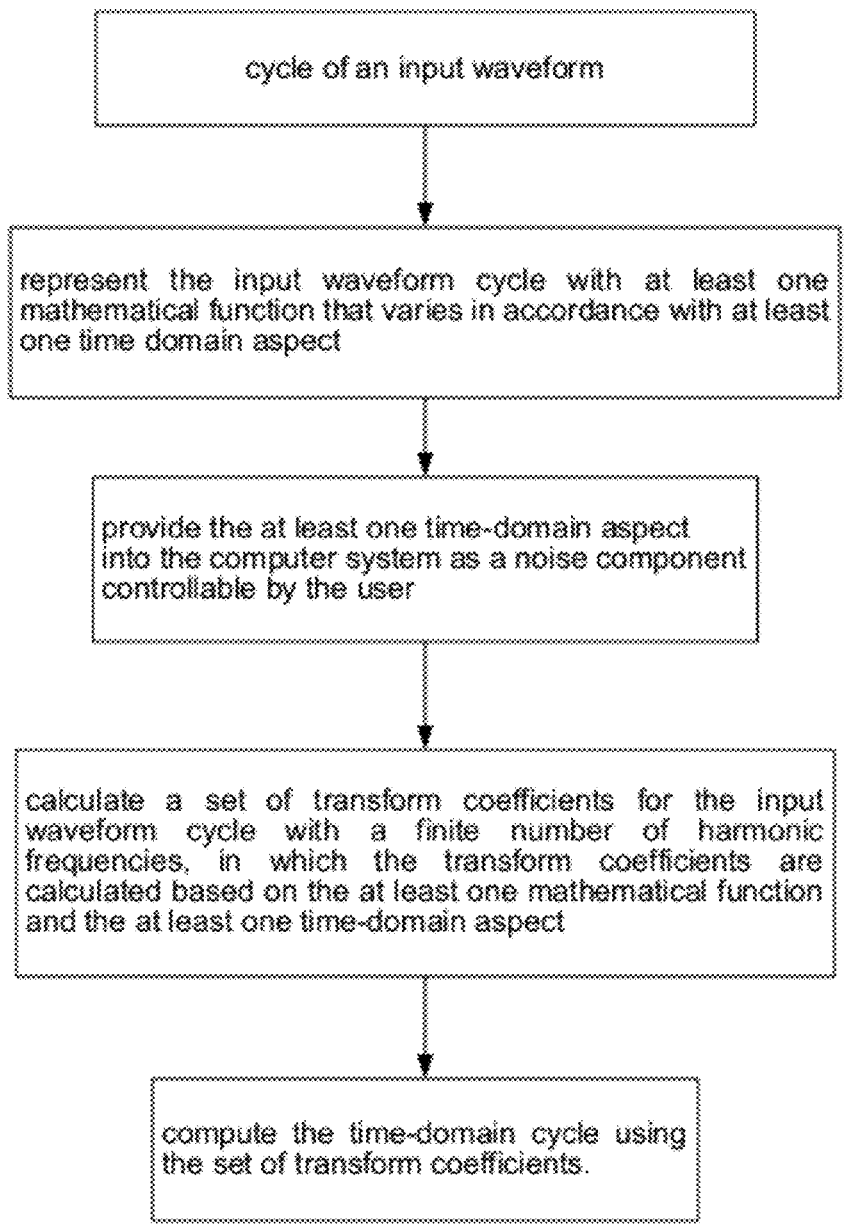
FIGS. 16A-16E computer-implementable flow charts illustrating various embodiments of the invention.

FIG. 16A sets forth an exemplary method for generating a single time-domain cycle having a noise component present therein. This method essentially involves the analysis of a single cycle of a given waveform, while other techniques (FIGS. 16B-D) address the generation of multi-cycle waveforms. In accordance with the method of FIG. 16A, a cycle of the input waveform is represented with at least one mathematical function which is a function of at least one time-domain aspect, such as risetime or falltime. This time-domain aspect represents a singular instance of noise in the cycle and is controllable through user input to the computer system. Next, a set of transform coefficients (e.g., Fourier coefficients $A_o, A_n, B_n$) is calculated for the input waveform cycle using a finite number of harmonic frequencies. As illustrated earlier, transform coefficients are calculated as a function of the at least one mathematical function and the at least one time-domain aspect. Finally the time-domain cycle is computed for each set of transform coefficients using, for example, an IFFT.

Figure 16B:
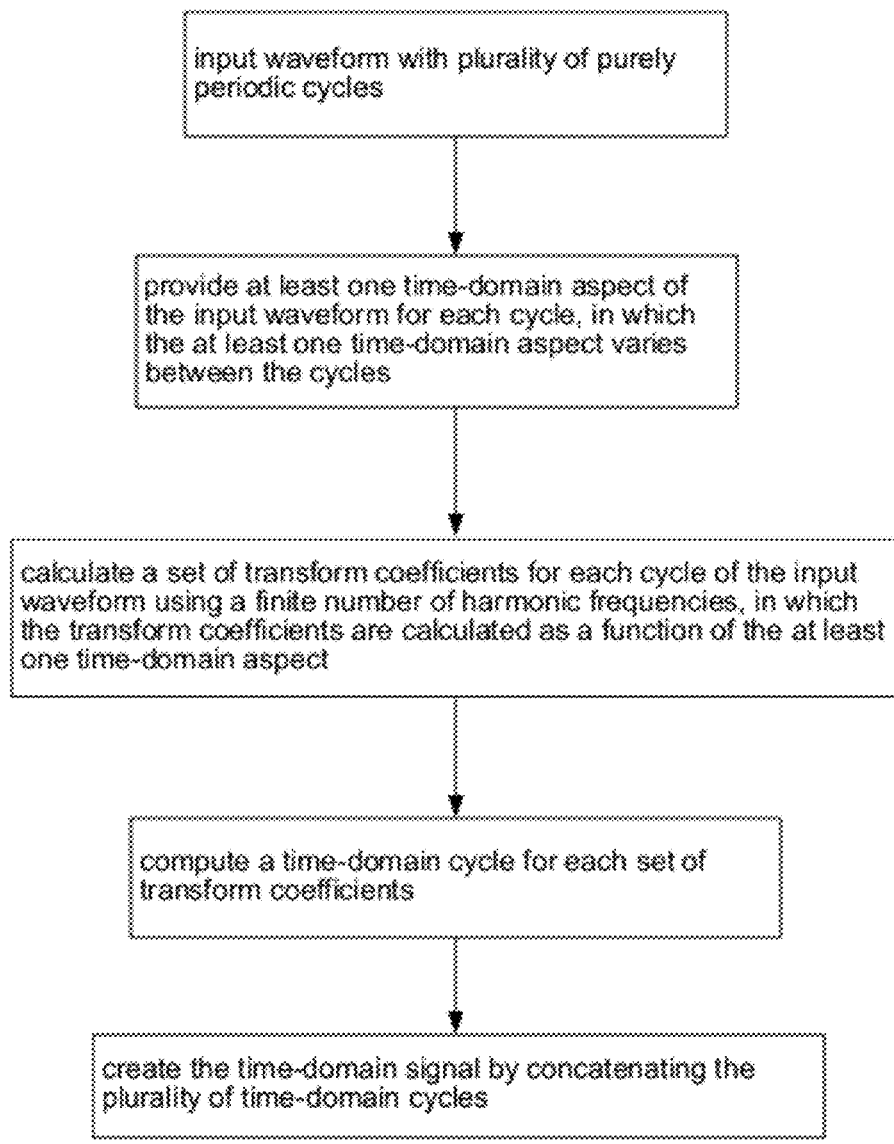

FIG. 16B illustrates the generation of a time-domain signal for simulation having a noise component. In this instance, the input waveform comprises a plurality of purely periodic cycles. As a first step, at least one time-domain aspect of the input waveform is provided for each cycle of the input waveform (e.g., rise or falltime), such that the time-domain aspect varies between the cycles (either randomly or deterministically as noise). Then, a set of transform coefficients is calculated for each cycle using a finite number of harmonic frequencies. As before, the transform coefficients are calculated as a function of the at least one time-domain aspect of the waveform. Thereafter, a time-domain cycle is computed for each set of transform coefficients, e.g., by using an IFFT. And then the time-domain signal to be simulated is created by concatenating the plurality of time-domain cycles.

Figure 16C:
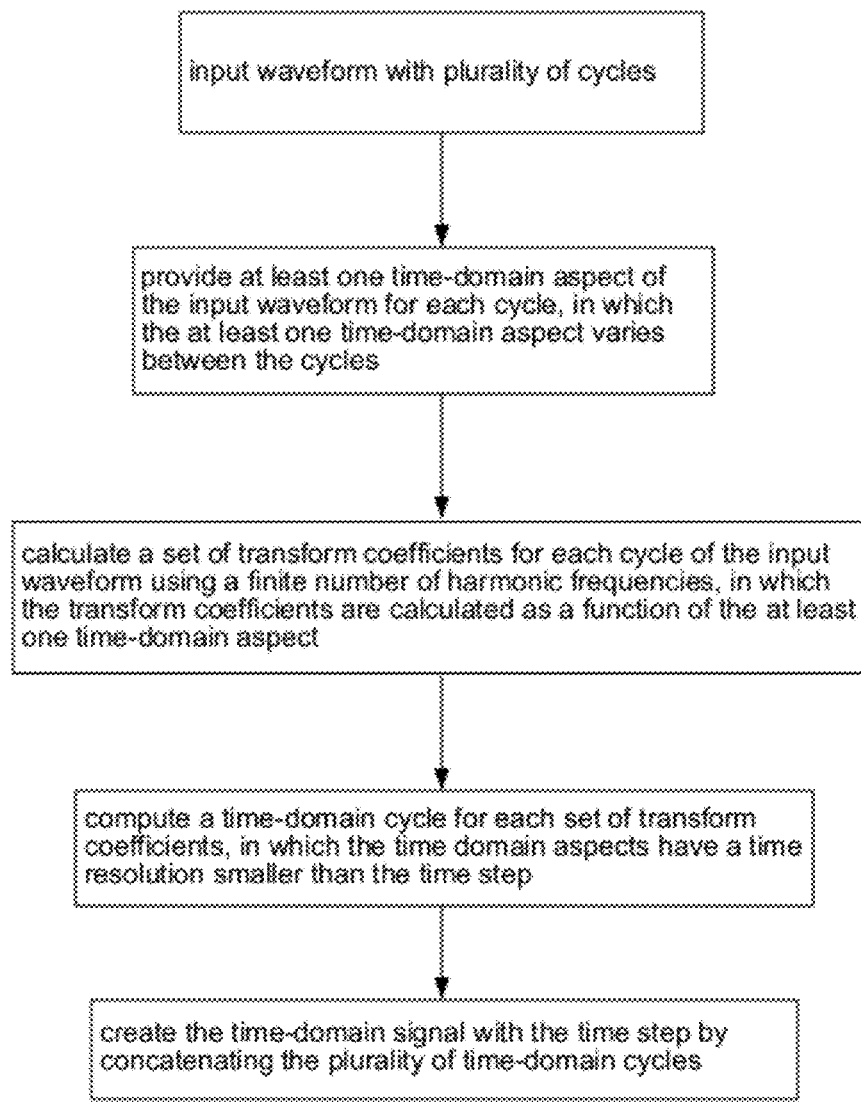

FIG. 16C likewise illustrates the generation of a time-domain signal for simulation having a noise component, in which the input waveform comprises a plurality of cycles. In the first step, at least one time-domain aspect of the input waveform is provided for each cycle of the input waveform, in which the time-domain aspect varies between the cycles as noise. Then, a set of transform coefficients is calculated for each cycle using a finite number of harmonic frequencies. Again, the transform coefficients are calculated as a function of the at least one time-domain aspect of the waveform. Next, a time-domain cycle is computed for each set of transform coefficients. Highlighting a particular benefit of this embodiment of the invention, the resulting time domain aspects have a time resolution smaller than the time step of the input waveform (e.g., 50 fs versus 10 ps as noted earlier). Lastly, the time-domain signal is created with time step by concatenating the plurality of time-domain cycles, resulting in a signal to be simulated with a relatively large time step, but formed of time domain signals having a relatively small time resolution.

Figure 16D:
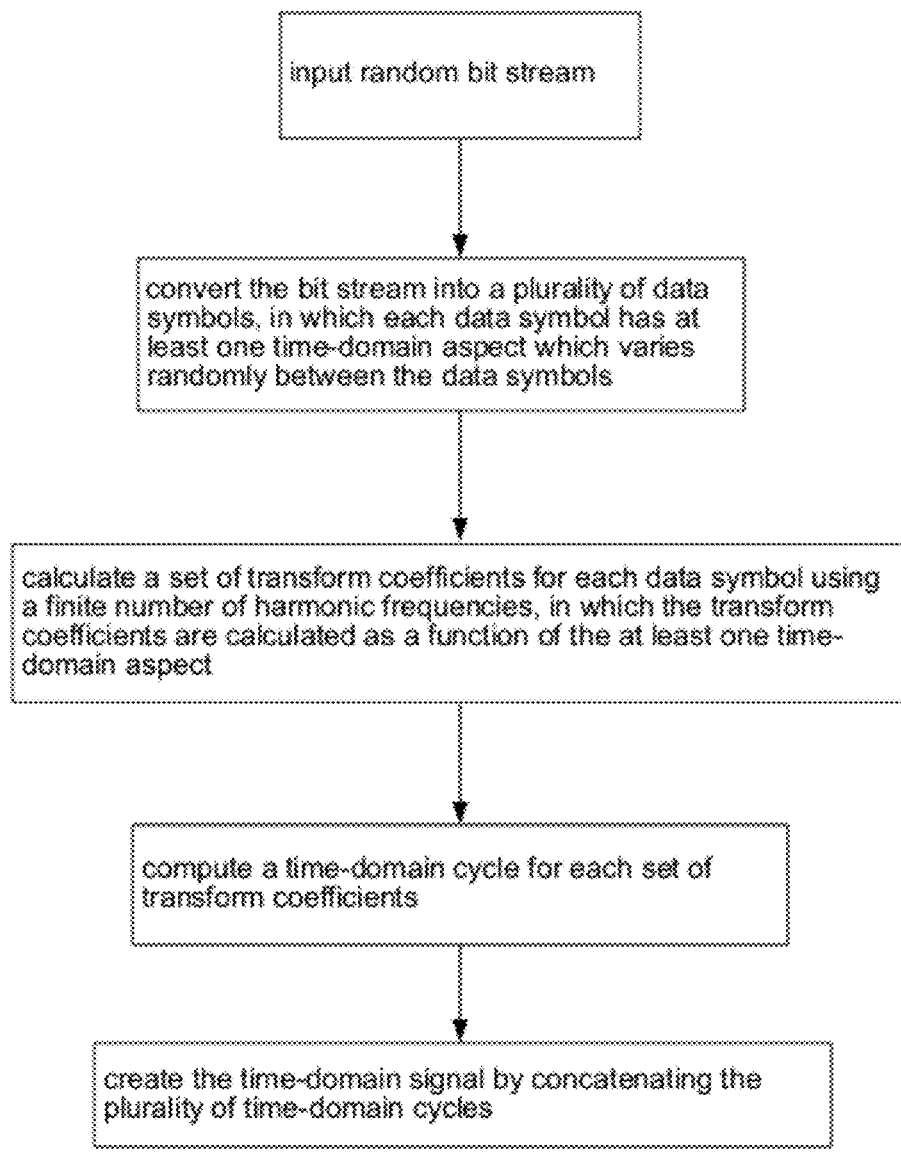

FIG. 16D also illustrates the generation of a time-domain signal for simulation having a noise, in which the input comprises a random bit stream. As a first step, the bit stream is converted into a plurality of data symbols, in which each data symbol has at least one time-domain aspect that varies randomly between the data symbols as noise. Thereafter a set of transform coefficients is calculated for each of the data symbols using a finite number of harmonic frequencies, and one again the transform coefficients are calculated as a function of the at least one time-domain aspect for each data symbol. Next, a time-domain cycle for each set of transform coefficients is computed. And just as in the precedent technique, the time-domain signal is created by concatenating the plurality of time-domain cycles.

Figure 16E:
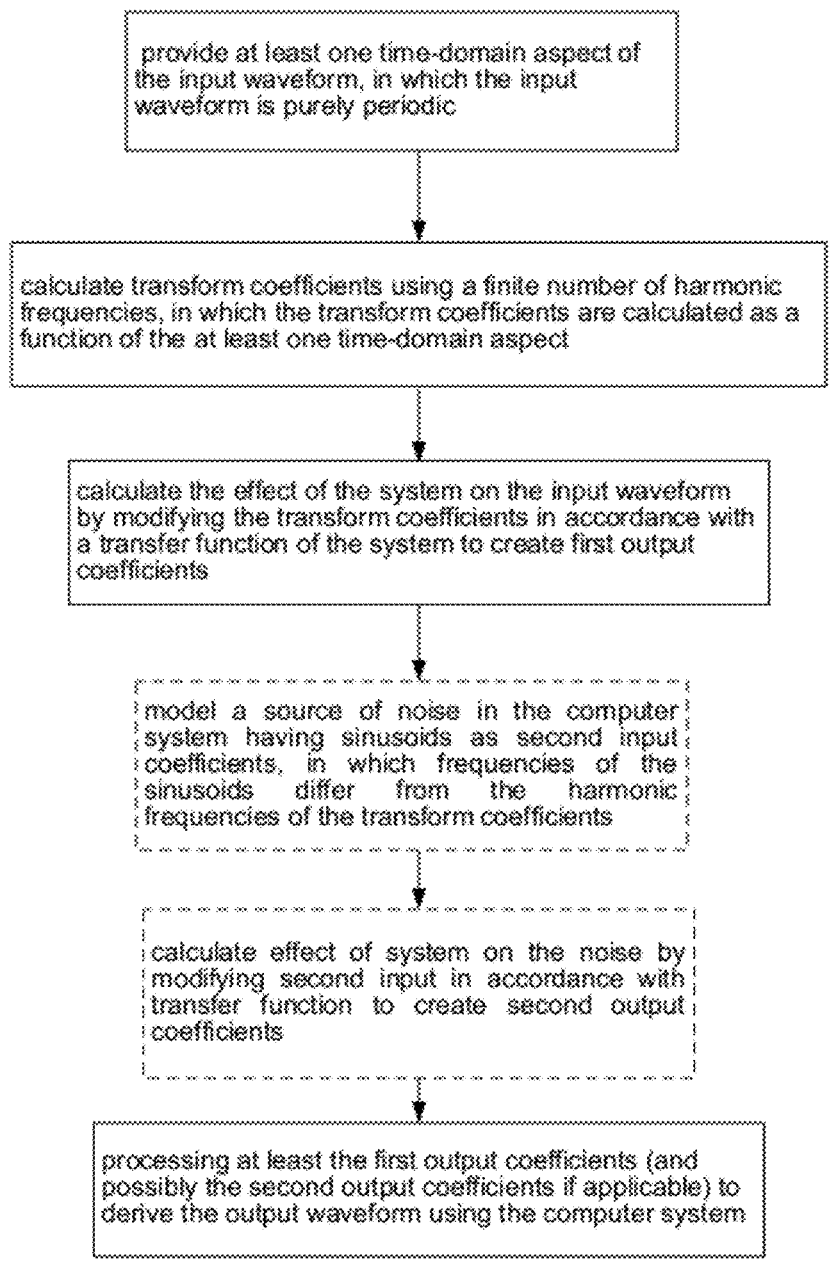

The method illustrated in FIG. 16E goes further than those methods of FIGS. 16A and 16D in that it does not merely create a waveform for simulation, but rather actually generates and simulates the waveform in the frequency domain, resulting in an efficient simulation. According to this method, at least one time-domain aspect of the input waveform is provided, in which the input waveform is purely periodic. Next, transform coefficients are calculated using a finite number of harmonic frequencies, in which the transform coefficients are calculated as a function of the at least one time-domain aspect. Thereafter, the effect of the system on the input waveform is calculated by modifying the transform coefficients in accordance with a transfer function of the system to create first output coefficients. Next, and optionally (as indicated by the dotted lines), a source of noise is modeled as sinusoids having second input coefficients. Preferably, the frequencies of the sinusoids differ from the harmonic frequencies of the transform coefficients. In this option, the effect of the system on the noise is calculated by modifying the second input coefficients in accordance with the system transfer function to create second output coefficients. Lastly, at least the first output coefficients (and possibly the second output coefficients if applicable) are processed to derive the output waveform.

Conclusion:

As chip-to-chip signaling reaches and exceeds the physical bandwidth of the transmission channel, designers not only face the challenge of restoring signal integrity, but must also address the difficulties associated with modeling the growing impact of timing jitter. To avoid lengthy simulation time, high-speed link modeling has shifted away from the transistor level. Yet even at higher levels, voltage noise and timing jitter are often modeled independently, as methods for combining the two in realistic signal generation and simulation have not been readily available.

The disclosed techniques employ Fourier theory to generate both periodic clock signals and aperiodic data signals while providing complete control over the noise and jitter characteristics of the derived waveforms. By constructing the waveforms from their respective frequency components, sub-femtosecond jitter resolution can be achieved even when the simulation time step is several orders of magnitude larger.

As such, a simulation of the synergistic relationship between voltage noise and timing jitter, particularly ISI and DDJ, can be provided which is not possible with independent models.

To gain the combined precision of realistic signals and transistor-level simulation, in one embodiment, only a few lines of code need be added to the underlying wave formation to write the time versus voltage values of signals generated through this approach to .PWL files that may be directly imported into Spice-based simulations. By so doing, timing critical circuits may be more readily identified, characterized, and compensated for to produce more robust designs.

While the techniques disclosed produce both periodic and aperiodic waveforms and therefore provide for all signal types included in the typical circuit simulation, it is also possible to use a periodic clock waveform generated through this approach to derive an aperiodic data signal directly. For example, as was mentioned in the Background, Agilent has implemented a trigger-able data source within its simulation environment that outputs a random data symbol when triggered by an associated clock edge. But because this tool is only capable of generating clock waveforms with Gaussian distributed jitter, the corresponding data signal jitter characteristics are likewise limited. Such limitations would be overcome if the simulator-provided clock signal, with limited jitter capability, was replace with a waveform derived through the techniques proposed herein. For just as the jitter characteristics of periodic waveforms derived through the proposed methods are unconstrained, so too would the jitter on the resulting "triggered" data signal be unconstrained.

It should be understood that the disclosed techniques can be implemented in many different ways to the same useful ends as described herein. In short, it should be understood that the inventive concepts disclosed herein are capable of many modifications. To the extent such modifications fall within the scope of the appended claims and their equivalents, they are intended to be covered by this patent.

What is claimed is:

1. A method implementable in a computer system for generating a time-domain signal for a simulation, wherein the input to the method comprises a set of time-domain aspects comprising a plurality of cycles, comprising:
   modifying in the computer system at least one time-domain aspect of at least some of the cycles, wherein a magnitude of the modification of the time-domain aspect varies between the cycles;
   using the computer system to process each modified cycle to produce a time-domain cycle for each modified cycle; and
   creating the time-domain signal by concatenating the plurality of time-domain cycles.

2. The method of claim 1, wherein the time-domain aspect of the input waveform comprises a voltage level.

3. The method of claim 1, wherein the time-domain aspect comprises a risetime or a falltime.

4. The method of claim 1, wherein the time-domain aspect comprises a period.

5. The method of claim 1, wherein the time-domain aspect varies randomly between the cycles.

6. The method of claim 1, wherein the time-domain aspect varies deterministically between the cycles.

7. The method of claim 1, wherein processing each modified cycle comprises a frequency transformation of each modified cycle followed by an inverse frequency transformation to produce each time-domain cycle.

8. The method of claim 7, wherein the frequency transformation is limited to a finite number of harmonics.

9. The method of claim 1, wherein each time-domain cycle comprises a constant time step.

10. The method of claim 9, wherein the time-domain aspects have a time resolution smaller than the time step.

11. The method of claim 1, wherein the simulation assumes transmission of the time-domain signal down a channel with a maximum frequency, and wherein processing each cycle of the input waveform is performed as a function of the maximum frequency.

12. The method of claim 1, wherein the set of time-domain aspects define an input waveform.

13. The method of claim 12, wherein the input waveform is purely periodic.

14. The method of claim 1, wherein the set of time-domain aspects are derived from a waveform.

15. The method of claim 1, further comprising converting the time-domain signal to a file format.

16. The method of claim 15, further comprising importing the file format to simulation software.

17. A method implementable in a computer system for generating a time-domain signal for a simulation, wherein the input to the method comprises a set of time domain aspects comprising a random bit stream comprising a plurality of data symbols, comprising:

modifying in the computer system at least one time-domain aspect of at least some of the data symbols, wherein a magnitude of the modification of the time-domain aspect varies between the data symbols;

using the computer system to process each modified data symbol to produce a time-domain cycle for each modified data symbol; and creating the time-domain signal by concatenating the plurality of time-domain cycles.

18. The method of claim 17, wherein the time-domain aspect of the data symbol comprises a voltage level.

19. The method of claim 17, wherein the time-domain aspect of the data symbol comprises a risetime or a falltime.

20. The method of claim 17, wherein the time-domain aspect of the data symbol comprises a period.

21. The method of claim 17, wherein the time-domain aspect of the data symbol comprises a phase.

22. The method of claim 17, wherein the time-domain aspect of the data symbol varies randomly between the data symbols.

23. The method of claim 17, wherein the time-domain aspect of the data symbol varies deterministically between the data symbols.

24. The method of claim 17, wherein processing each modified data symbol comprises a frequency transformation of each data symbol followed by an inverse frequency transformation to produce each time-domain cycle.

25. The method of claim 24, wherein the frequency transformation is limited to a finite number of harmonics.

26. The method of claim 17, wherein each time-domain cycle comprises a constant time step.

27. The method of claim 26, wherein the time-domain aspects have a time resolution smaller than the time step.

28. The method of claim 17, wherein the simulation assumes transmission of the time-domain signal down a channel with a maximum frequency, and wherein processing each modified data symbol is performed as a function of the maximum frequency.

29. The method of claim 17, wherein the set of time-domain aspects are derived from a waveform.

30. The method of claim 17, further comprising converting the time-domain signal to a file format.

31. The method of claim 29, further comprising importing the file format to simulation software.

* * * * *